(12) United States Patent
Fafard et al.

(10) Patent No.: US 9,018,515 B2
(45) Date of Patent: Apr. 28, 2015

(54) SOLAR CELL WITH EPITAXIALLY GROWN QUANTUM DOT MATERIAL

(75) Inventors: Simon Fafard, Ottawa (CA); Bruno J. Riel, Ottawa (CA)

(73) Assignee: Cyrium Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 13/173,638

(22) Filed: Jun. 30, 2011

(65) Prior Publication Data

US 2011/0277829 A1 Nov. 17, 2011

Related U.S. Application Data

(63) Continuation-in-part of application No. 12/954,777, filed on Nov. 26, 2010, which is a continuation of application No. 11/038,230, filed on Jan. 21, 2005, now Pat. No. 7,863,516.

(60) Provisional application No. 60/537,259, filed on Jan. 20, 2004, provisional application No. 61/365,555, filed on Jul. 19, 2010.

(51) Int. Cl.
*H01L 31/06* (2012.01)
*H01L 31/0352* (2006.01)
(Continued)

(52) U.S. Cl.
CPC *H01L 31/035236* (2013.01); *H01L 31/035209* (2013.01); *H01L 31/0352* (2013.01); *H01L 31/075* (2013.01); *H01L 31/0735* (2013.01); *H01L 31/0725* (2013.01); *H01L 31/105* (2013.01); *H01L 31/035218* (2013.01); *B82Y 10/00* (2013.01); *B82Y 20/00* (2013.01); *B82Y 30/00* (2013.01); *B82Y 40/00* (2013.01); *H01L 31/0687* (2013.01); *Y02E 10/544* (2013.01)

(58) Field of Classification Search
CPC ............... H01L 31/035236; H01L 31/035209; H01L 31/0352; H01L 31/075; H01L 31/0735; H01L 31/0725; H01L 31/105; H01L 31/035218; B82Y 20/00
USPC ......................................................... 136/255
See application file for complete search history.

(56) References Cited

U.S. PATENT DOCUMENTS

| 4,206,002 | A | 6/1980 | Butera |
| 4,419,530 | A | 12/1983 | Nath |

(Continued)

FOREIGN PATENT DOCUMENTS

| CN | 1272225 | 11/2001 |
| EP | 0984484 | 3/2000 |

(Continued)

OTHER PUBLICATIONS

Laghumavarapu, Improved device performance of InAs/GaAs quantum dot solar cells with GaP strain compensation layers, Dec. 2007, Applied Physics Letters, vol. 91, pp. 243115-1-243115-3.*

(Continued)

*Primary Examiner* — Devina Pillay
(74) *Attorney, Agent, or Firm* — Louis B. Allard; Borden Ladner Gervais LLP

(57) ABSTRACT

A solar cell with spaced apart groupings of self-assembled quantum dot layers interposed with barrier layers. Such groupings allow improved control over the growth front quality of the solar cell, the crystalline structure of the solar cell, and on the performance metrics of the solar cell.

15 Claims, 10 Drawing Sheets

(51) Int. Cl.
*H01L 31/075* (2012.01)
*H01L 31/0735* (2012.01)
*H01L 31/0725* (2012.01)
*H01L 31/105* (2006.01)
*B82Y 10/00* (2011.01)
*B82Y 20/00* (2011.01)
*B82Y 30/00* (2011.01)
*B82Y 40/00* (2011.01)
*H01L 31/0687* (2012.01)

(56) References Cited

U.S. PATENT DOCUMENTS

| | | | |
|---|---|---|---|
| 4,575,577 | A | 3/1986 | Fraas |
| 4,667,059 | A | 5/1987 | Olson |
| 4,688,068 | A | 8/1987 | Chaffin |
| 4,694,115 | A | 9/1987 | Lillington et al. |
| 5,009,719 | A | 4/1991 | Yoshida |
| 5,019,177 | A | 5/1991 | Wanlass |
| 5,223,043 | A | 6/1993 | Olson |
| 5,330,585 | A | 7/1994 | Chang |
| 5,405,453 | A | 4/1995 | Ho |
| 5,407,491 | A | 4/1995 | Freundlich |
| 5,614,435 | A | 3/1997 | Petroff |
| 5,851,310 | A | 12/1998 | Freundlich |
| 6,166,320 | A | 12/2000 | Nagashima |
| 6,239,449 | B1 | 5/2001 | Fafard |
| 6,252,287 | B1 | 6/2001 | Kurtz |
| 6,340,788 | B1 | 1/2002 | King |
| 6,372,980 | B1 | 4/2002 | Freundlich |
| 6,444,897 | B1 | 9/2002 | Luque-Lopez |
| 6,559,480 | B1 | 5/2003 | Inuzuka |
| 6,566,595 | B2 | 5/2003 | Suzuki |
| 6,583,436 | B2 | 6/2003 | Petroff |
| 6,597,017 | B1 | 7/2003 | Seko et al. |
| 6,951,819 | B2 | 10/2005 | Iles |
| 2001/0023942 | A1* | 9/2001 | Kim et al. ............ 257/14 |
| 2001/0028055 | A1 | 10/2001 | Fafard et al. |
| 2002/0050288 | A1 | 5/2002 | Suzuki |
| 2005/0040413 | A1 | 2/2005 | Takahashi et al. |
| 2005/0247339 | A1* | 11/2005 | Barnham et al. ......... 136/262 |
| 2006/0185582 | A1 | 8/2006 | Atwater, Jr. et al. |
| 2007/0151592 | A1* | 7/2007 | Forrest et al. ............ 136/243 |

FOREIGN PATENT DOCUMENTS

| | | |
|---|---|---|
| EP | 1130657 | 9/2001 |
| EP | 1333509 | 8/2003 |
| JP | 03-250673 | 11/1991 |
| JP | 03285363 | 12/1991 |
| JP | 09237908 | 9/1997 |
| JP | 11087689 | 3/1999 |
| JP | 11214726 | 8/1999 |
| JP | 11330606 | 11/1999 |
| JP | 2001-044453 | 2/2001 |
| JP | 2001230431 | 8/2001 |
| JP | 2001308354 | 11/2001 |
| JP | 2002141531 | 5/2002 |
| JP | 2002203977 | 7/2002 |
| WO | 02058200 | 7/2002 |

OTHER PUBLICATIONS

Ekins-Daukes, Strained and strained balanced quantum well devices for high efficiency tandem solar cells, Apr. 2001, Solar Energy Materials and Solar Cells, vol. 68, pp. 71-87.*
PCT Application No. PCT/CA2011/050402, International Search Report dated Sep. 13, 2011.
U.S. Appl. No. 12/954,777, Office Action dated Aug. 22, 2011.
Ekins-Daukes et al., "Strain-Balanced Criteria for Multiple Quantum Well Structures and Its Signature in X-Ray Rocking Curves," Crystal Growth and Design, Apr. 2002, vol. 2 (4), pp. 287-292.
Marti et al., "Quantum Dot Intermediate Band Solar Cell," IEEE, Photovoltaic Specialists Conference, Sep. 15-22, 2000, pp. 940-943.
English Translation of Japanese Patent Application No. 2006-548059, Office Action dated Mar. 23, 2011.
European Patent Application No. 05700284, Search Report dated Feb. 4, 2009.
Australian Patent Application No. 2005205373, Search Report dated Dec. 10, 2008.
English Translation of Chinese Patent Application No. 20050002861.2, Office Action dated May 9, 2008.
Fafard et al., "Manipulating the Energy Levels of Semiconductor Quantum Dots", Phys. Rev. B59, 1999, pp. 15368-15373.
Piva et al., "Enhanced Degradation Resistance of Quantum Dot Lasers to Radiation Damage", Appl. Phys. Lett. 77, 2000, pp. 624-626.
Fafard et al., "Lasing in Quantum Dot Ensembles with Sharp Adjustable Electronic Shells", Appl., Phys., Lett. 75, 1999, pp. 986-988.
U.S. Appl. No. 11/038,230, Notice of Allowance dated Aug. 30, 2010.
Japanese Patent Application No. 2011-144221, English Translation of Office Action dated Jan. 17, 2013.
U.S. Appl. No. 12/954,777, Office Action dated May 2, 2013.
Alguno et al., "Improved Quantum Efficiency of Solar Cells With Ge Dots Stacked in Multilayer Structure", 3rd World Conference on Photovoltaic Energy Conversion, May 11-18, 2003, pp. 2746-2749.
European Patent Application No. 05700284.2, Office Action dated Apr. 8, 2013.
Oshima et al., "Fabrication of Self-Organized GaInNAs Quantum Dots by Atomic H-assisted RF-molecular Beam Epitaxy", Journal of Crystal Growth, vol. 261, No. 1, Jan. 15, 2004, pp. 11-15.
Friedman et al., "1-eV GaInNAs Solar Cells for Ultrahigh-Efficiency Multijunction Devices", 2nd World Conference and Exhibition on Photovoltaic Solar Energy Conversion, Jul. 6-10, 1998, pp. 3-7.

* cited by examiner

SOLAR CELL WITH EPITAXIALLY GROWN QUANTUM DOT MATERIAL

CROSS REFERENCE TO RELATED APPLICATIONS

The present application is a continuation-in-part of application Ser. No. 12/954,777, filed Nov. 26, 2010, which is continuation of application Ser. No. 11/038,230, filed Jan. 21, 2005, which claims priority to 60/537,259, filed Jan. 20, 2004. The present application also claims the benefit of Provisional Patent Application No. 61/365,555, filed Jul. 19, 2010, all of the above of which are incorporated herein by reference in their entirety.

FIELD

The present disclosure relates generally to photovoltaic solar cells. More particularly, the present disclosure relates to solar cells having formed therein self-assembled quantum dots.

BACKGROUND

The growth of solar cells with self-assembled quantum dot layers typically requires that multiple layers of self-assembled quantum dots, intercalated (interposed) with barrier material layers, be formed atop a substrate. As the material used in forming self-assembled quantum dots layer has a different lattice constant than the material used in forming the barrier material, strain is present in the multiple layers of self-assembled quantum dots, and in the intercalated (interposed) barrier material layers. As such, the number of self-assembled quantum dot layer/barrier layer units that can be formed atop each before the onset of lattice defects, such as, for example, dislocations, can be limited.

The limit on the number of quantum dot and barrier layers can be made large by choosing appropriately the thickness and composition of the quantum dot and barrier layers by, for example, ensuring that the average lattice constant of the region (volume) containing the quantum dot layers and the barrier layers remains substantially the same as that of the substrate. The region containing the quantum dot layers and the barrier layers can be referred to as the quantum material region or as the region containing the quantum dots or the self-assembled quantum dots.

As used herein, the expression "average lattice constant" means the average of the nominal lattice constants of the materials in the solar cell, weighed in accordance with (as a function of) the amount (thickness, number of bonds) of each material in the solar cell. When the average lattice constant of the region containing the self-assembled quantum dots remains substantially the same as that of the substrate, the in-plane lattice constant remains the same throughout the quantum material region, i.e., the quantum material region is coherently strained, and the average of the vertical lattice constant will be substantially equal to the substrate lattice constant. This means that the quantum material is coherent with the substrate, and minimal strain relaxation is present in the form of defects such as, e.g., dislocations, anti-sites, substitutional defects, vacancy defects, or point defects.

The expression "in-plane lattice constant" refers to the plane perpendicular to the growth direction of the quantum dot and barrier layers. The expression "vertical lattice constant" refers to the lattice constant in the growth direction of quantum dot and barrier layers. Unless the average in-plane lattice constant is substantially equal to that to the substrate, strain can accumulate and defects can eventually form in the quantum material region to relax the strain. Such defects can reduce the minority carrier lifetime, which can be detrimental to device (e.g., a solar cell) performance.

Nevertheless, even when care is taken to ensure that the average in-plane lattice constant is substantially the same as that of the substrate, the quality of the quantum material in the case of a stack with multiple repeats of intercalated self-assembled quantum dot layers and barrier layers can be compromised by such unwanted defects if no particular precaution is taken in the layer sequence.

Additionally, the stack of intercalated self-assembled quantum dot layers and barrier layers can be sensitive to process condition variations during their epitaxial growth, leading to unwanted defects (e.g., dislocations). The lattice defects generally lead to a decrease in performance metrics such as, for example, conversion efficiency, fill factor, and open-circuit voltage, and/or the defects can reduce the number of devices per manufactured wafer, that meet pre-determined performance criteria per (i.e., the defects can lead to poor manufacturing yield).

Improvements in solar cells having self-assembled quantum dot layers is therefore desirable.

SUMMARY

In a first aspect, there is provided a photovoltaic solar cell that comprises a base material with a base material lattice constant; and a plurality of semiconductor layers formed on the base material. The plurality of semiconductor layers include: first layers of a first semiconductor material, the first semiconductor material having a first lattice constant. The plurality of semiconductor layer also include second layers of a second semiconductor material, the second semiconductor material having a second lattice constant, the second layers being interposed between the first layers. The plurality of semiconductor layers further include at least one semiconductor spacer layer each having a respective spacer layer lattice constant. The first layers and the second layers are arranged in at least two groupings. The at least two groupings are separated from each other by one of the at least one semiconductor spacer layer. T thickness of the at least one spacer layer is a function of a target thickness-weighed average lattice constant value for the plurality of the semiconductor layers.

The plurality of semiconductor layers can include an intermediary semiconductor layer formed on the base material. One of the at least two groupings can be formed on the intermediary semiconductor layer.

In the photovoltaic solar cell of the first aspect, the lattice constant of the first semiconductor material can be denoted by $a_1$; the lattice constant of the second semiconductor material can be denoted by $a_2$; the intermediary layer can have a thickness $t_{int}$ and can be made of a semiconductor material having a lattice constant $a_{int}$; each spacer layer can be made of a same semiconductor material with a spacer layer lattice constant denoted by $a_s$; a thickness-weighed average lattice constant $\langle a \rangle$ can be calculated as:

$$\langle a \rangle = \frac{a_1 \sum_i t_{1i} + a_2 \sum_i t_{2i} + a_s \sum_i t_{si} + a_{int} t_{int}}{\sum_i t_{1i} + \sum_i t_{2i} + \sum_i t_{si} + t_{int}}$$

wherein: $t_{1i}$ is the thickness of layer i made of the first semiconductor material; $t_{2i}$ is the thickness of layer i made of the second semiconductor material; $t_{si}$ is the thickness of layer i made of the spacer layer semiconductor material.

In the photovoltaic solar cell of the first aspect, the base material can be one of a semiconductor substrate and an epitaxially-grown semiconductor. The first layers can be compressively strained layers with a first layers bandgap energy, and the second layers can be barrier layers with a barrier layer bandgap energy, the barrier layer bandgap energy being larger than the first layers bandgap energy, and the first lattice constant being larger than the second lattice constant by a factor ranging between 2% and 10%. The compressively strained layers can comprise self-assembled quantum dots. The self-assembled quantum dots can be coherently strained. The compressively strained layers can be obtained by epitaxy using a Stranski-Krastanow growth mode.

In the photovoltaic solar cell of the first aspect, the lattice constant of the spacer layer can be substantially equal to that of the base material. Each of the at least one spacer layer can have a same thickness.

In the photovoltaic solar cell of the first aspect, the base material lattice constant can be a base material lattice constant parallel to a growth plane of the photovoltaic solar cell; the first lattice constant can be a first semiconductor material lattice constant parallel to the growth plane of the photovoltaic solar cell; the second lattice constant can be a second semiconductor material lattice constant parallel to the growth plane of the photovoltaic solar cell; each respective spacer layer lattice constant can be a spacer layer lattice constant parallel to the growth plane of the photovoltaic solar cell.

In the photovoltaic solar cell of the first aspect, the target thickness-weighed average lattice constant value can be equal to the base material lattice constant. The target thickness-weighed average lattice constant value can be larger than the base material lattice constant. The target thickness-weighed average lattice constant value can be smaller than the base material lattice constant.

In the photovoltaic solar cell of the first aspect, the base material can be a group IV semiconductor material. The first layers, second layers and at least one semiconductor spacer layer can be made of group III and group V semiconductor materials.

In the photovoltaic solar cell of the first aspect, the photovoltaic solar cell can include a plurality of p-n junctions. Further, the solar cell can be a pseudomorphic solar cell or a metamorphic solar cell.

Other aspects and features of the present disclosure will become apparent to those ordinarily skilled in the art upon review of the following description of specific embodiments of the disclosure in conjunction with the accompanying figures.

BRIEF DESCRIPTION OF THE DRAWINGS

Embodiments of the present disclosure will now be described, by way of examples only, with reference to the attached Figures, wherein.

DETAILED DESCRIPTION

Generally, the present disclosure provides a solar cell with spaced apart groupings of self-assembled quantum dot layers interposed with barrier layers. Such groupings allow improved control over the growth front quality of the solar cell, the crystalline structure of the solar cell, and on the performance metrics of the solar cell.

A first embodiment of the present disclosure is related to a high efficiency monolithic three-junction photovoltaic solar cell. Three-junction photovoltaic solar cells can be fabricated by stacking p-n or n-p junctions made of different semiconductor materials. As is known, conversion efficiencies of approximately 30% have been obtained using a Ge bottom subcell grown on a Ge substrate, with a GaAs middle subcell and a GaInP or AlGaAs top subcell. The efficiency of such a multijunction photovoltaic solar cell is improved in the present disclosure by using self-assembled quantum dot material in the middle subcell instead of bulk GaAs.

Figure 1:
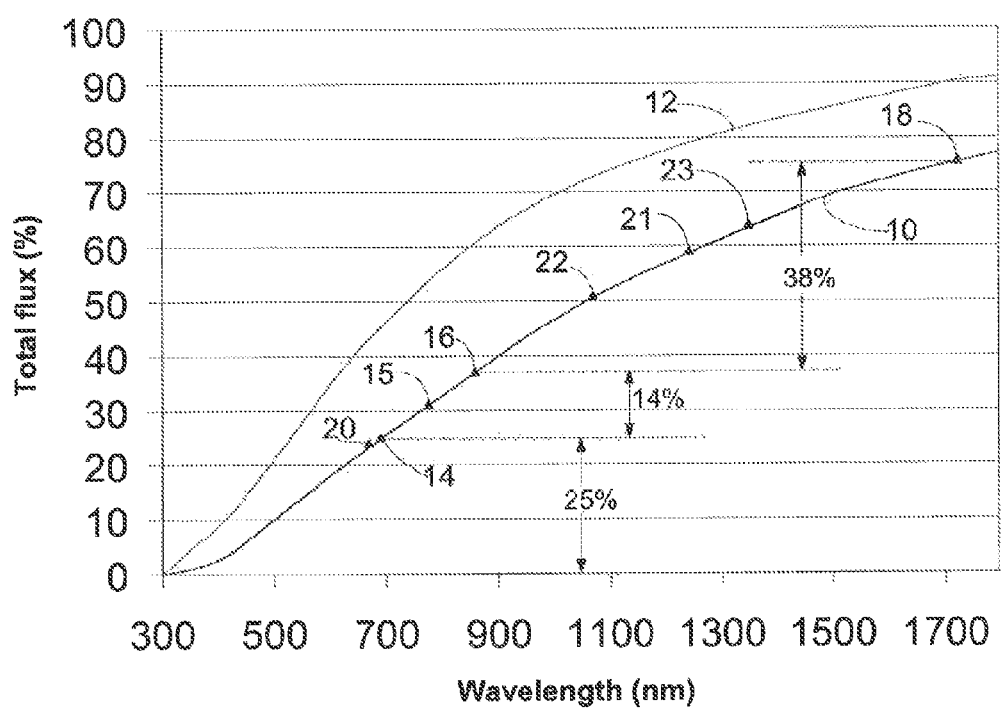
FIG. 1 shows the percentage of the AM0 solar photon and power fluxes integrated from 200 nm.

The principle of the disclosure is illustrated in FIG. 1 where plot 10 shows the percentage of the AM0 solar photon flux, integrated from the 200 nm wavelength, as a function of wavelength, and plot 12 shows the percentage of the AM0 solar power flux integrated from 200 nm wavelength as a function of wavelength. Reference numerals on plot 10 indicate semiconductor materials and their absorption edges. These semiconductor materials can be used in converting photons (solar or otherwise) to electrical carriers. The plotted points of FIG. 1 are referred to in the description as cells, subcells, particular semiconductor material or absorption edges, depending on the particular context in which they appear.

To optimize the conversion efficiency of a solar cell, the current of each subcell must be substantially equal since the subcells are connected in series. Neglecting the reflection at the surface of the device, which is a valid approximation for solar cells equipped with an antireflection coating, the light intensity transmitted at a depth z from the surface of the semiconductor is given by $I(z)=I_o\exp(-\alpha z)$. $I_o$ is the input intensity and $\alpha$ is the semiconductor absorption coefficient, which is a function of the wavelength dependent density of states of the material (i.e., $\alpha$ is wavelength dependent). For sufficiently thick semiconductor material, only light having a wavelength longer than the semiconductor bandgap equivalent wavelength (or with an energy less than the bandgap energy) will transmit through the semiconductor layer since the density of states drops, as does $\alpha$, for photon energies less than the bandgap energy. For direct bandgap semiconductors, at wavelengths shorter than the bandgap wavelength, $\alpha$ is in the $10^4$ cm$^{-1}$ to $10^5$ cm$^{-1}$ range and each impinging photon can create a pair of photocarriers; that is, an electron and a hole.

The current in a subcell is proportional to the fraction of photon flux absorbed by the subcell. As can be inferred from plot 10, a GaInP/GaAs/Ge solar cell absorbs about 25% of the photon flux in its top GaInP subcell 14, approximately 14% in its middle GaAs subcell 16, and approximately 38% in the bottom Ge subcell 18. Replacing the top GaInP subcell 14 with an AlGaAs subcell 20 would yield similar results.

The imbalance in the absorption of the solar photon flux by subcells 14, 16 and 18 leads to a current imbalance. That is, the Ge bottom subcell 18 is generating the most current and the middle GaAs subcell 16 is limiting the overall current and conversion efficiency. The overall conversion efficiency can be improved by substituting GaAs material 16 with a material having an effective bandgap wavelength of about 1070 nm (1.16 eV). As will be shown in more detail below, such a material can be a self-assembled quantum dot material 22. By using quantum dot material 22 in the middle subcell, the solar photon flux absorption of each of the three subcells is about 25% of the total solar photon flux and the current generated by each subcell will be equal. The theoretical efficiency can be calculated to give the thermodynamic limit of photovoltaic energy conversion. The theoretical efficiency takes into account the bandgap of the subcell, the impinging photon flux and its spectral distribution to estimate the corresponding open-circuit voltage ($V_{oc}$) and the short-circuit current ($J_{sc}$) as described by, for example, Baur et al in paper 3P-B5-07 of the WCPEC-3 Proceedings Osaka, 2003. For an optimized configuration, the conversion efficiency could theoretically exceed 40%.

Figure 2:
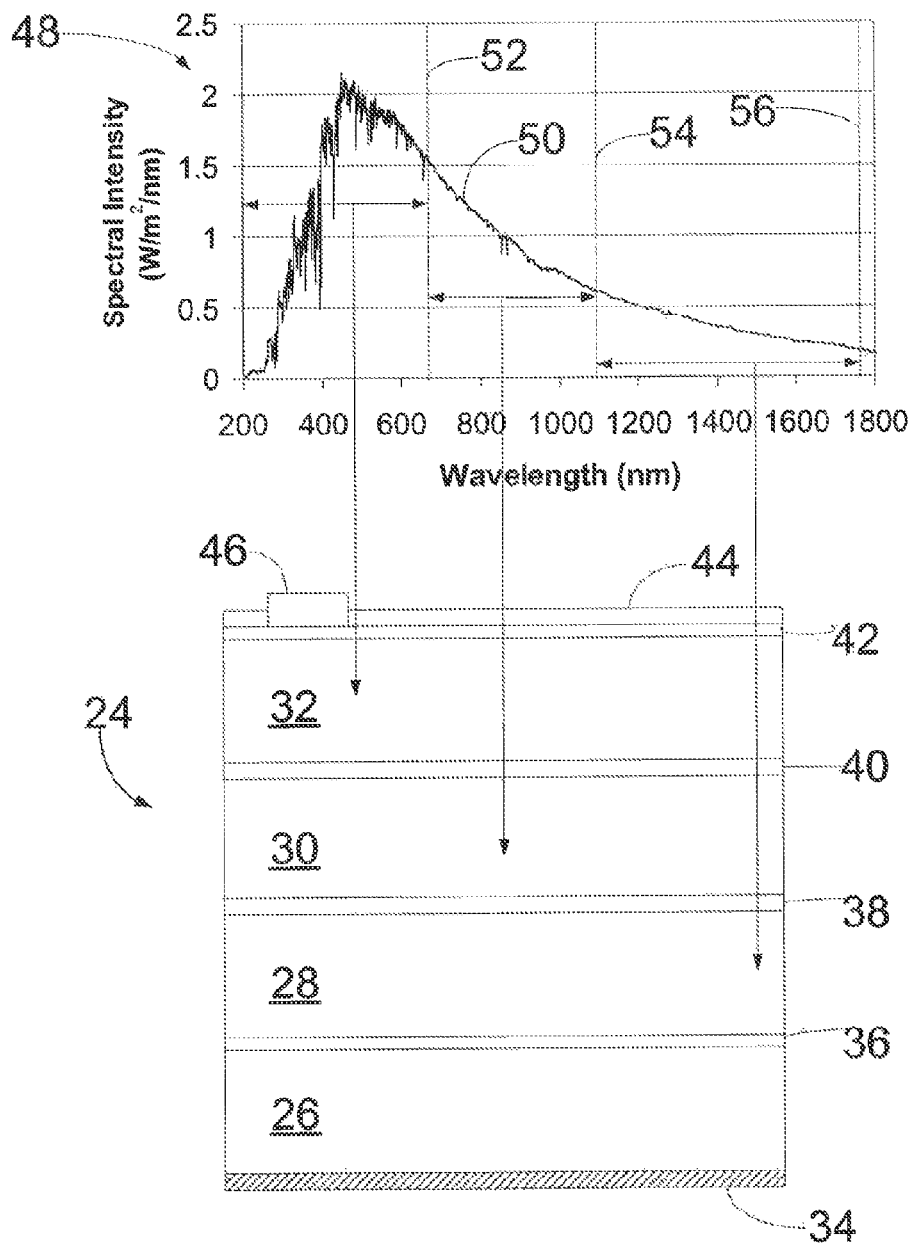
FIG. 2 depicts a monolithic three-subcell photovoltaic solar cell of the present disclosure.

The details of such a monolithic three-junction photovoltaic solar cell is illustrated is FIG. 2 (not to scale), which sketches an embodiment for the solar cell of the present disclosure. The multijunction solar cell 24 comprises a substrate 26, first subcell 28, second subcell 30 pseudomorphically grown by epitaxy and comprising self-assembled In(Ga)As/GaAs quantum dot material, and third subcell 32. The In(Ga)As/GaAs quantum dot material of second subcell 30 can be tailored to obtain an effective bandgap of about 1.16 eV. Other techniques can be used to produce similar nanostructures using other epitaxial techniques such as selective area epitaxy, templated epitaxy, epitaxy with stained-induced bandgap modified heterostructures, Volmer-Weber growth modes, modified Stranski-Krastanow growth modes, Frank-Van der Merwe growth modes combined or not with high-resolution microfabrication, or, non-epitaxial techniques involving, for example, colloidal quantum dots; however, the optical and/or structural properties of such nanostructures are typically not suited for improving the efficiency of multijunction solar cell devices.

According to this embodiment of the disclosure, the substrate 26 can be conductive GaAs or conductive Ge, both of them having a similar lattice constant. The doping of substrate 26 can be n-type or p-type. Whether substrate 26 is n-type with an n-p or an n-i-p junction grown on top or, p-type with a p-n or a p-i-n junction grown on top, is not fundamental to the present disclosure. For illustration purposes, this embodiment will use an n-type substrate with n-p or n-i-p junction. Other possible combinations, which could include an undoped substrate and buried back contacts, are equally possible. Substrate 26 may be metallized to form ohmic contact 34 on the backside, as illustrated in FIG. 2, and a buffer and/or back field layers 36 can be grown between substrate 26 and first subcell 28 to optimize various structural, electrical, or optical properties. First subcell 28 can be made of Ge and includes an n-p junction to create a depletion region. A tunnel junction 38 is used to connect first subcell 28 with second subcell 30.

As will be readily understood by a person skilled in the art, tunnel junction 38 can be made of a high quality material that can be epitaxially grown on first subcell 28. The tunnel junction 38 can be highly doped to provide good electrical conduction and to support high current densities and, is preferably transparent to photons traversing it. For this embodiment, the tunnel junction 38 can be made of a highly doped GaAs n-p junction but many other combinations supporting the requirements herein are equally valid.

The second subcell 30 comprises a self-assembled In(Ga)As/GaAs quantum dot material, adapted to, or tailored to, obtain an effective bandgap of about 1.16 eV. More details about second subcell 30 are given in FIG. 4 and its corresponding description where it is disclosed to contain an n-p or an n-i-p junction comprising a plurality of layers with high-quality self-assembled In(Ga)As/GaAs quantum dots of a specific shape, composition, and density, grown pseudomorphically by epitaxy.

The second subcell 30 is electrically connected to third subcell 32 via tunnel junction 40. The requirements for the tunnel junction 40 are similar to those for the tunnel junction 38 discussed above. In this embodiment, the tunnel junction 40 can be made of a highly doped InGaP or AlGaAs n-p junction but many other combinations are equally valid. The third subcell 32 is essentially an n-p junction preferably made of doped GaInP or doped AlGaAs, or a similar alloy latticed-matched to GaAs, with a bandgap around 1.8 eV. The third subcell 32 may include a window 42, an antireflection layer 44, and a contact 46 as is customary in multijunction solar cells.

The top part of FIG. 2 shows graph 48 of spectral intensity as a function of wavelength for the solar spectrum 50. FIG. 2 also illustrates absorption ranges 52, 54 and 56 of solar spectrum 50 for third subcell 32, second subcell 30 and first subcell 28 respectively. In view of the discussion relating to FIG. 1, it will be clear for someone skilled in the art that such a three-junction photovoltaic solar cell has good current matching between the subcells together with high conversion efficiencies.

Figure 3:
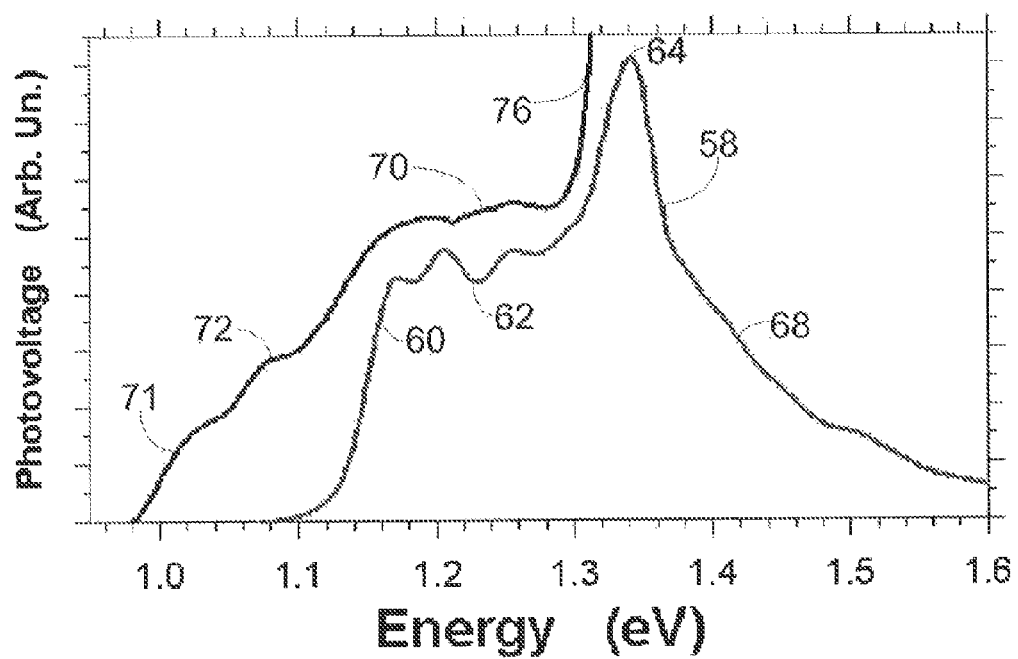
FIG. 3 shows photovoltaic spectra of self-assembled quantum dot materials.

FIG. 3 shows a photovoltaic spectrum 58 of high quality self-assembled quantum dot materials, i.e. materials that may be comprised within the second subcell 30, grown within a p-i-n junction. The plot 58 shows the spectrum of a first material measured at 20° C. The features of the plot 58 are quantum dot material ground states 60, quantum dot material excited states 62 and wetting layer states 64, a wetting layer being a thin continuous layer that usually forms during the epitaxy of the self-assembled quantum dots. In this self-assembling epitaxial process, the first monolayer, or first few monolayers, are deposited in uniform two-dimensional layers called the wetting layers. Quantum dots then self-assemble from the additional material deposited and/or in part from the previous wetting layer material. The plot 58 was measured using a white light source transmitted through GaAs layers. Signal decrease 68 is observed for energies greater than the GaAs bandgap. The quantum dot ground states 60 can be referred to as the effective bandgap of a self-assembled quantum dot material. For bulk semiconductors not comprising semiconductor heterostructures, the effective bandgap is simply the bandgap of the semiconductor material.

It is known that quantum dots energy levels can be adjusted by controlling their shape, composition, and density during growth [for example see: S. Fafard, et al., "Manipulating the Energy Levels of Semiconductor Quantum Dots", Phys. Rev.

B 59, 15368 (1999) or S. Fafard, et al., "Lasing in Quantum Dot Ensembles with Sharp Adjustable Electronic Shells", Appl. Phys. Lett. 75, 986 (1999).]. For the plot 58, the self-assembled In(Ga)As/GaAs quantum dot material was tailored to have an effective bandgap of about 1.16 eV. The material measured in the plot 58 contains 14 layers of In(Ga)As quantum dots separated with 10 nm barriers made of GaAs.

Figure 4:
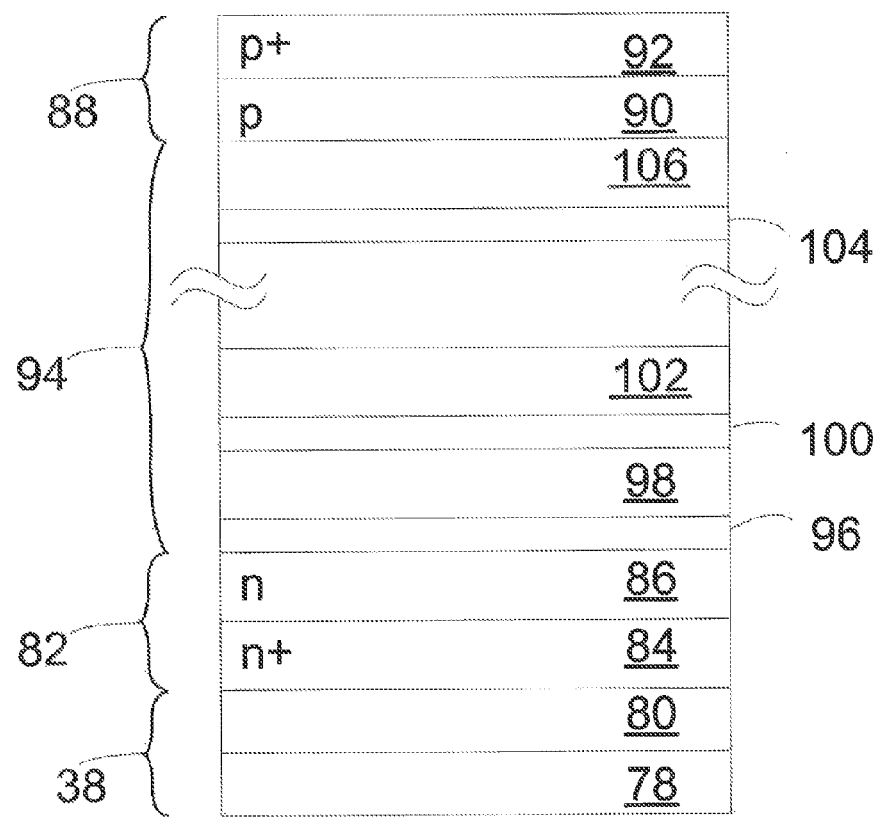
FIG. 4 depicts a self-assembled quantum dot material of the present disclosure.

An embodiment of another solar cell 30 is shown in FIG. 4. There, a plurality of III-V semiconductor alloy layers is grown epitaxially on a tunnel junction 38, which comprises heavily p-doped layer 78 and heavily n-doped layer 80. An emitter 82 is formed by the combination of highly n-doped layer 84 and n-doped layer 86. The emitter 82 is preferably made of GaAs or from another alloy lattice-matched to GaAs and has a bandgap close to the bandgap of GaAs. Similarly, a collector 88 is later grown using p-type doping for layer 90 and highly p-doped layer 92. Silicon can be used for n-type doping while beryllium can be used for p-type doping. Other dopants may be used such as, for example, Zinc (Zn), Tellurium (Te), or others.

The emitter 82 and collector 88 form an n-i-p junction together with intrinsically undoped self-assembled quantum dot material 94 disposed between emitter 82 and collector 88. The doping profiles of emitter 82 and collector 88 are such that they provide a depletion region extending substantially across self-assembled quantum dot material 94. Similar configurations can be designed using an n-p junction instead of an n-i-p one, or by reversing the order of the p and n doping. Additionally, since self-assembled quantum dot material 94 is pseudomorphically grown on GaAs, Bragg reflectors or distributed Bragg reflector (DBR) cavities comprising alternate layers of high and low index of refraction semiconductors may be grown within the emitter and/or the collector, to enhance the reflectivity and change the absorption properties of the subcell and consequently of the solar cell 24. Similar self-assembled quantum dot material 94, together with emitter 82 and collector 88, as depicted in FIG. 4, will be used in the description of other embodiments in the present disclosure.

The self-assembled quantum dot material 94 comprises a first quantum dot layer 96, a first barrier 98, a second quantum dot layer 100, a second barrier 102 and so on up to $N^{th}$ self-assembled quantum dot material 104 and $N^{th}$ barrier 106. It will be clear for one skilled in the art that the N quantum dot layers need not be identical in thickness or composition. Furthermore, layers can be inserted in the self-assembled quantum dot material 94 to optimize optical, structural or electrical properties of solar subcells such as the second subcell 30. For example, layers with other bandgaps or with a another lattice constant can be grown above and/or below quantum dot layers 96, 100, 104 to modify the optical and/or the structural properties of the quantum dot material 94. Also, layers with other bandgaps or with another lattice constant can be grown within the barriers 98, 102, 106. The growth of such intermediate layers within the barriers is particularly important to control the total strain built in the structure. For example, the thickness of semiconductor layers having a lattice constant smaller than the epitaxial layer and smaller than the lattice constant of the substrate can be chosen to yield layers that would compensate for the strain introduced when using a semiconductor with a larger lattice constant for the quantum dot layers. For example, GaPAs or GaInP can be grown within the barriers to compensate the strain of the InAs or InGaAs quantum dots. Furthermore, the plurality of layers can contain a number of sub-groups of layers having similar properties, such that N layers would be composed of m sub-groups each containing a number $m_i$ of quantum dot and barriers layers having a similar size, composition, and effective bandgap.

In the present embodiment, growth materials and parameters can be chosen to obtain self-assembled quantum dot material 94 with desired absorption characteristics such as, for example, an absorption edge at 1.16 eV. Pseudomorphic growth of the self-assembled quantum dot material 94 is obtained by epitaxy using, for example, a molecular beam epitaxy (MBE) system. The MBE system is used for growing, for example, GaAs or AlGaAs layers on a semiconductor material lattice-matched to GaAs. Epitaxy systems other than MBE systems can be used. They may include, for example, chemical beam epitaxy (CBE), metal organic chemical vapor deposition (MOCVD) or other similar hybrid systems or combination thereof. To obtain the desired optical, electrical and structural properties, the growth temperature is maintained in a range that optimizes the desired properties while avoiding high temperatures that could cause intermixing of layers or diffusion of dopants present, for example, in emitter 82 or collector 88 layers.

As an example, when intermixing or diffusion of the dopants in emitter 82 layers is not a concern, the growth of the GaAs layers is can be done in a temperature range comprised between 400° C. and 800° C., preferably between 520° C. and 630° C. and most preferably between 600° C. and 630° C. In the case where intermixing and/or diffusion of dopants is a concern during the epitaxial growth of the quantum dot layers, the growth temperature can be comprised between of 450° C. and 550° C., preferably between of 490° C. and 530° C. The growth temperature of the quantum dot layers is used to adjust the shape and composition of the quantum dots. The temperature during the overgrowth of the barrier of each quantum dot layer may be varied at different stages of the overgrowth to further control the size and composition of the quantum dots and therefore the absorption characteristics of the self-assembled quantum dot material 94.

The combination of growth temperature, the group V overpressure or the III/V ratio, the quantum dot material, the amount of material used to obtain the self-assembled growth transition between a uniform quasi two-dimensional film to three-dimensional islands, the growth rate or the pauses used during the growth, and the overgrowth conditions such as growth temperature and growth rate, are chosen to obtain quantum dot layers having a high in-plane density of highly uniform quantum dots having desired energy levels. This allows high conversion efficiencies of impinging solar photons into electricity.

As will be apparent to one skilled in the art, there are many combinations of parameters that can accomplish the desired absorption characteristics. However, for illustration purposes of the present embodiment, the desired absorption of the self-assembled quantum dot material 94 can be obtained by growing InAs on GaAs, the thickness of InAs being comprised between 0.6 nm and 0.8 nm and preferably comprised between 0.68 nm and 0.72 nm. The preferred growth rate of InAs is comprised between 0.001 and 3 nm/s and most preferably between 0.01 and 0.03 nm/s, with a growth pause following the InAs deposition, the growth pause preferably ranging from 0 to 300 seconds. The growth of the InAs quantum dot layer is followed with the over-growth of a barrier layer having a thickness ranging from 6 nm to 50 nm, the barrier layer preferably being GaAs or $Al_xGa_{1-x}As$, x being comprised between 0 and 1 but preferably comprised between 0 and 0.35. The growth sequence of quantum dot layer and barrier layers is repeated a number of times as stated above.

As mentioned above, a specific temperature cycling of the substrate may be used to adjust the shape, composition, and uniformity of the quantum dots during the overgrowth of the quantum dot layers and barrier layers. In this case, the temperature of the substrate 26 can be increased preferably above the InAs disorption temperature which is roughly 530° C. for MBE growth and can depend, amongst different factors, on the growth method and on the use of a surfactant. Once the temperature has been increased above the InAs disorption temperature, it is decreased back to a nominal value preferably comprised between 450° C. and 550° C., preferably between 490° C. and 530° C. This is followed by the growth of a subsequent quantum dot layer. In the case where the desired absorption edge is 1.16 eV, the temperature cycling performed during the over-growth may occur when the thickness of the barrier is comprised between 1 nm and 50 nm, preferably between 2.0 nm and 10.0 nm, and most preferably between 4.5 nm and 6.5 nm.

The number of quantum dot layers can be comprised between 1 and 100 preferably between 30 and 80. It is possible to grow more layers if necessary. The larger the number of layers of self-assembled quantum dot layer material 94, the larger the absorption coefficient of the second cell 30 will be, which is desirable to increase the current of the second cell 30.

The distance between the quantum dot layers, i.e., the barrier thickness, is adjusted to (A) change the desired characteristics of the absorption spectrum; (B) control the vertical stacking of the self-assembled quantum dots; and (C) maintain the overall strain level below that related to the critical thickness that leads to the onset of lattice relaxation. For thicknesses above the critical thickness, the quantum dot material could start developing material dislocations and defects. The critical thickness can be measured and/or estimated by using, for example, Matthew's law. For the average InGaAs composition of interest with low indium content the critical thickness is expected to be between 1 and 2 microns. The critical thickness is smaller for higher average indium content. The distance between the quantum dot layers can therefore be used to adjust the average indium composition of the quantum dot material and avoid dislocations and defects caused by strain and lattice relaxation. As discussed above, the quantum dot layers typically have a larger lattice constant than the rest of the structure and therefore the embodiment can also incorporate thin layers of semiconductors such as GaPAs or InGaP with the opposite strain (i.e. smaller lattice constant) for the purpose of reducing the average strain in the quantum dot material if necessary. For example, as mentioned above, layers with a different lattice constant can be grown above and/or below the quantum dot layers 96, 100, 104 to modify the structural properties of the quantum dot material 94, or similarly layers with a different lattice constant can be grown within the barriers 98, 102, 106.

A second embodiment of the disclosure provides high efficiency monolithic four-junction photovoltaic solar cells. The self-assembled quantum dot material 94 may be adapted to absorb photons with energies greater than about 1.0 eV, indicated as material 21 in FIG. 1. Such a material can be used to fabricate a high-efficiency monolithic four-junction photovoltaic solar cell depicted in FIG. 5 where the subcells will be current-matched if each of the subcells absorbs about 19% of the solar flux.

The four-junction solar cell comprises substrate 108 upon which first subcell 110 is fabricated. The First subcell 110 preferably includes germanium with an appropriate doping profile, the germanium being grown on substrate 108 by epitaxy or by other crystal growth methods. Alternatively, the first subcell 110 can be fabricated by intermixing or implanting dopants in bulk germanium material such as, for example, a Ge substrate to create the appropriate doping profile. For example, when III-V semiconductor materials are grown on p-type Ge, the intermixing of the group V within the Ge of the substrate will form an n-type Ge region and therefore a p-n junction. Similarly for an n-type Ge substrate, the intermixing of the group III within the Ge of the substrate would form a p-type region and therefore an n-p junction. Second subcell 112 is pseudomorphically grown on first subcell 110 by epitaxy and comprises a self-assembled In(Ga)As/GaAs quantum dot material adapted to obtain an effective bandgap of about 1.0 eV. The third subcell 114 is pseudomorphically grown on second subcell 112 by epitaxy and is followed by the fourth subcell 116, which is pseudomorphically grown on third subcell 114 by epitaxy.

Figure 5:
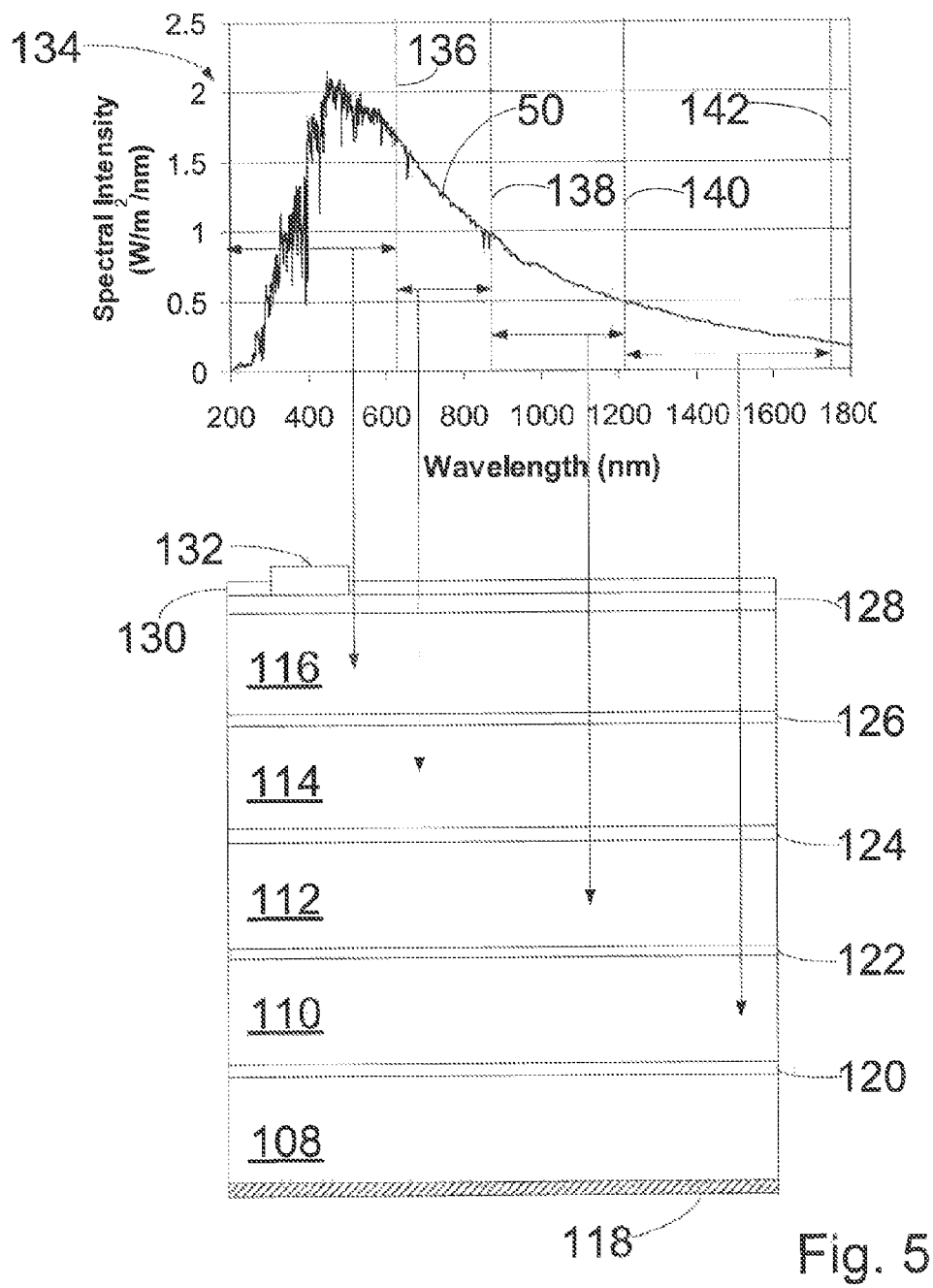
FIG. 5 depicts a monolithic four-subcell photovoltaic solar cell of the present disclosure.

In this embodiment, the substrate 108 can be conductive GaAs or preferably Ge, each of them having a similar lattice constant. The doping of substrate 108 can be n-type or p-type. Whether the substrate 108 is n-type with an n-p or an n-i-p junction grown on top or, p-type with a p-n or a p-i-n junction grown on top, is not fundamental to the present disclosure. For illustration purposes, this embodiment will use an n-type substrate with n-p or n-i-p junctions. Other possible combinations, which could include an undoped substrate and buried back contacts, are equally possible. In the final steps of the process, the substrate 108 may be metallized to form an ohmic contact 118, as illustrated in FIG. 5.

A buffer and/or back field layer 120 can be fabricated on the substrate 108 prior to the growth of the first subcell 110 to optimize various structural, electrical, or optical properties. The first subcell 110 can be made of Ge and includes an n-p junction to provide a depletion region. A tunnel junction 122 is used to connect the first subcell 110 with the second subcell 112. As will be readily understood by a person skilled in the art, the tunnel junction 122 is preferably made of a high quality material which can be epitaxially grown on the first subcell 110 and is highly doped to provide good electrical conduction and to support high current densities. The tunnel junction 122, as all tunnel junctions described herein, can be substantially transparent to photons traversing it.

For this embodiment, the tunnel junction 122 can be made of a highly doped GaAs n-p junction but other types of tunnel junctions are possible such as AlGaAs, or alloys of AlGaInAsP with a lattice constant close to that of GaAs. As previously stated, second subcell 112 comprises self-assembled In(Ga)As/GaAs quantum dot material tailored to obtain an effective bandgap of about 1.0 eV. The details of the second subcell 122 are similar to the ones disclosed in FIG. 4 and its corresponding description, but with modifications as far as the growth parameters of the self-assembled quantum dot material. Further details regarding the growth of the second subcell 112 appear below. For now, suffice to say that second subcell 112 comprises a self-assembled quantum dot material and an n-p or n-i-p junction. The self-assembled quantum dot material includes a plurality of layers with high quality self-assembled In(Ga)As/GaAs quantum dots of specified shape, composition, and density grown pseudomorphically by epitaxy.

The second subcell 112 is connected to the third subcell 114 via tunnel junction 124. The tunnel junction 124 can be made of a high quality material, which can be epitaxially grown on the third cell 112 and is highly doped to provide good electrical conduction and to support high current densities. The tunnel junction 124 is substantially transparent to photons traversing it. In this embodiment, the tunnel junction 124 can be made of a highly doped GaAs, InGaP, AlGaAs, or AlGaInAsP n-p junction, the alloy used having a lattice constant close to that of GaAs and a bandgap equal or greater than that of GaAs.

The third subcell 114 is essentially an n-p junction preferably made of doped GaAs or of an AlGaInAsP or GaInNAs alloy latticed-matched to GaAs and having a bandgap around 1.4 eV. For some configurations, to help balance the current of the subcells, it might be desirable to adjust the thickness and absorption characteristics of the third subcell 114 such that the third subcell 114 lets part of the light impinging on it reach second subcell 112. The third subcell 114 is connected to a fourth subcell 116 via a tunnel junction 126 which can be made of a highly doped InGaP or AlGaAs n-p junction but other alloys supporting the requirements mentioned above are equally valid, for example AlInGaP or ZnSe alloys.

The fourth subcell 116 is essentially an n-p junction preferably made of doped GaInP or AlGaAs, or a similar AlGaInAsP alloy latticed-matched to GaAs, and has a bandgap around 1.8 eV. Preferably, the thickness and absorption characteristics of the fourth subcell 116 are such that the fourth subcell 116 lets part of the light impinging on it reach the third subcell 114. Furthermore, the fourth subcell 116, the third subcell 114, the second subcell 112 and the first subcell 110 are such that the respective currents generated by photons absorbed by the respective cells are balanced. The fourth subcell 116 may include a window 128, an antireflection coating 130, and an electrical contact 132, as is customary in the fabrication of multijunction solar cells.

The top part of FIG. 5 shows graph 134 of the spectral intensity as a function of wavelength for the solar spectrum 50. FIG. 5 also illustrates absorption ranges 136, 138, 140 and 142 of the solar spectrum 50 for the fourth subcell 116, the third subcell 114, the second subcell 112 and the first subcell 110 respectively. It will be clear for someone skilled in the art, with the help of the description of FIG. 1, that such a four-junction photovoltage solar cell will have good current matching between the subcells with about 19% of the solar photon flux absorbed in each subcell, and consequently, high conversion efficiencies.

A measured photovoltaic spectrum of a high quality self-assembled quantum dot material grown within a p-i-n junction and having an absorption band edge of about 1.0 eV is shown as plot 70 in FIG. 3. There, the plot 70, measured at 20° C., shows spectral features associated with the quantum dot ground states 71, the quantum dot excited states 72 and the wetting layer states 76. This particular sample contains one single layer of In(Ga)As quantum dots embedded in GaAs barriers.

The growth conditions of the second subcell 112 can be adjusted so that the size and the composition of the quantum dots, together with the composition of the material adjacent to the quantum dots, yield a self-assembled quantum dot material with an absorption edge at an energy lower than 1.16 eV at about 1.0 eV. As discussed previously, there are many combinations of growth parameters that can accomplish the desired goal. However, for illustration purposes of the embodiment just described, the desired absorption characteristics of self-assembled quantum dot material 94 can be obtained by growing InAs on GaAs, the thickness of InAs being comprised between 0.4 nm and 0.8 nm, and preferably between 0.50 nm and 0.58 nm. The preferred growth rate of InAs is comprised between 0.001 and 3 nm/s and more preferably between 0.01 and 0.03 nm/s, with a growth pause following the InAs growth, the growth pause preferably ranging from 0 second to 300 seconds. The growth of the InAs quantum dot layer is followed by the over-growth of a barrier layer having a thickness ranging from 6 nm to 50 nm, the barrier layer preferably being a GaAs or an AlGaAs alloy with Al composition smaller than about 10% having a slightly higher bandgap. The growth sequence of quantum dot layer and barrier layers is repeated a number of times as previously stated. The preferred number of quantum dot layers is between 50 and 150 layers, or as required to balance the absorption in the subcells.

As mentioned above, a specific temperature cycling of substrate 108 may be used to adjust the shape, composition, and uniformity of the quantum dots during the overgrowth of the quantum dot layer. In this case, the temperature of substrate 108 is increased preferably above the InAs disorption temperature and decreased back to its nominal value before the growth of the subsequent quantum dot layer. In this case where the desired absorption edge is about 1.0 eV, the temperature cycling performed during the over-growth may occur when the thickness of the barrier is comprised between 1 nm and 50 nm, and preferably between 2.0 nm and 10.0 nm, and most preferably between 7.5 nm and 10.0 nm. Alternatively, alloys of slightly lower bandgap material than GaAs such InGaAs with low concentration of indium, or graded bandgap materials, can also be used adjacent to the quantum dot layers to extend absorption to longer wavelengths.

A method for incorporating self-assembled quantum dot material within a subcell of a multijunction monolithic photovoltaic solar cell may comprise the steps of: providing a substrate having a top surface with a lattice constant; providing a subcell, lattice-matched to said lattice constant, upon the previous layer; providing a tunnel junction, lattice-matched to said lattice constant, upon the previous subcell and repeating the last two steps until the subcell comprising self-assembled quantum dot material has to be incorporated. The last two steps are omitted if the self-assembled quantum dot material has to be incorporated in the bottom subcell. Further steps include: epitaxially depositing buffer layers, upon the previous layer, of semiconductor materials that are lattice-matched to the said lattice constant and having a buffer dopant concentration; epitaxially depositing back field layers, upon said buffer layers, of a semiconductor materials that are lattice-matched to the said lattice constant and having a back field dopant concentration; epitaxially depositing a first barrier layer, upon said back field, of a semiconductor material that is lattice-matched to the said lattice constant, and having a barrier dopant concentration and a barrier thickness grown at a barrier temperature. Additional steps are: epitaxially depositing a quantum dot layer, comprising a high density of uniform self-assembled quantum dots with a low density of defects and having a shape and a size, upon previous barrier, using a semiconductor with a nominal composition for the quantum dots, that is highly strained to the said lattice constant, and having a quantum dot dopant concentration, a quantum dot thickness, a quantum dot growth temperature, a quantum dot growth rate, a quantum dot group V overpressure or III-V ratio; epitaxially depositing a barrier layer, upon the previous quantum dot layer, after pausing the growth for a growth interruption time, of a semiconductor material that is lattice-matched to the said lattice constant, having a barrier dopant concentration, a barrier thickness, a barrier growth rate, and a barrier temperature profile for the temperature of the substrate during the overgrowth of the quantum dots; and repeating the last 2 steps for a number of periods, wherein said composition, said size, and said shape of the quantum dots are controlled and can be changed throughout the stacking profile via the growth parameters. More steps include: epitaxially depositing top field layers, upon the previous barrier layer, of semiconductor materials that are lattice-matched to the said lattice constant and having a top field dopant concentration;

epitaxially depositing a tunnel junction, upon said top field layers, of highly doped semiconductor materials that are lattice-matched to the said lattice constant and having a dopant concentration that is of the same type as said top field dopant for the initial part of the tunnel junction and abruptly changed to the opposite type for the final part of the tunnel junction; providing a subcell lattice-matched to said lattice constant upon the previous tunnel junction providing a tunnel junction lattice-matched to said lattice constant upon the previous subcell and repeating the last two steps to complete the number of subcells comprised in the said multijunction solar cell. Finally, the method includes: providing a window upon the top subcell, providing an antireflection coating upon said window and providing a contact layer connected to said top subcell. In the method just described, the dopant concentration of the said buffer layers is between $1 \times 10^{16}$ cm$^{-3}$ and $1 \times 10^{19}$ cm$^{-3}$, said dopant concentration of the said back field layers is between $1 \times 10^{16}$ cm$^{-3}$ and $1 \times 10^{19}$ cm$^{-3}$, said barrier dopant concentration is between $1 \times 10^{13}$ cm$^{-3}$ and $1 \times 10^{17}$ cm$^{-3}$, said quantum dot thickness is between 0.4 nm to 5.0 nm, said quantum dot growth temperature is between 450° C. and 540° C., said quantum dot growth rate is between 0.0001 nm/s and 0.2 nm/s, said growth interruption time is between 0 s and 600 sec, said barrier temperature profile is either constant or varying between 450° C. and 650° C., said barrier growth rate is between 0.01 nm/s and 1 nm/s, said barrier thickness is between 3 nm and 60 nm, said dopant concentration of the said top field layers is between $1 \times 10^{16}$ cm$^{-3}$ and $1 \times 10^{19}$ cm$^{-3}$. The lattice constant may be the lattice constant of GaAs, the alloy compositions of said buffer layers, said back field layers, said barrier material, and said top field layers, are between that of $Al_{0.3}Ga_{0.7}As$ and GaAs, and said nominal composition of the quantum dots is between that of $In_{0.3}Ga_{0.7}As$ and InAs; the lattice constant may be the lattice constant of GaAs, the alloy compositions of said buffer layers, said back field layers, said barrier material, and said top field layers, are between that of $Al_{0.9}Ga_{0.1}As$ and $Al_{0.1}Ga_{0.9}As$, and said nominal composition of the quantum dots is between that of $In_{0.3}Al_{0.7}As$ and InAs; or, the lattice constant may be the lattice constant of GaAs, the alloy compositions of said buffer layers, said back field layers, said barrier material, and said top field layers, are that of GaAlInP alloys latticed-matched to GaAs, and said nominal composition of the quantum dots is InP.

A third embodiment of the disclosure provides high efficiency monolithic dual-junction photovoltaic solar cells. In another embodiment, a self-assembled quantum dot material is adapted to be used in a dual-junction solar cell. In order to have a high efficiency photovoltaic dual-junction solar cell, a first subcell having a self-assembled quantum dot material similar to self-assembled quantum dot material 94, but with an absorption edge at 0.92 eV, is required together with a second subcell having a material absorbing photons with energies greater than about 1.6 eV. The second subcell may also include a self-assembled quantum material similar to self-assembled quantum dot material 94. Such a dual-junction solar cell would have balanced currents generated in each subcell. Furthermore, each subcell would absorb about 31% of the total solar photon flux, as shown on plot 10 in FIG. 1 where bandgap 15 (1.6 eV) and bandgap 23 (0.92 eV) are depicted.

Figure 6:
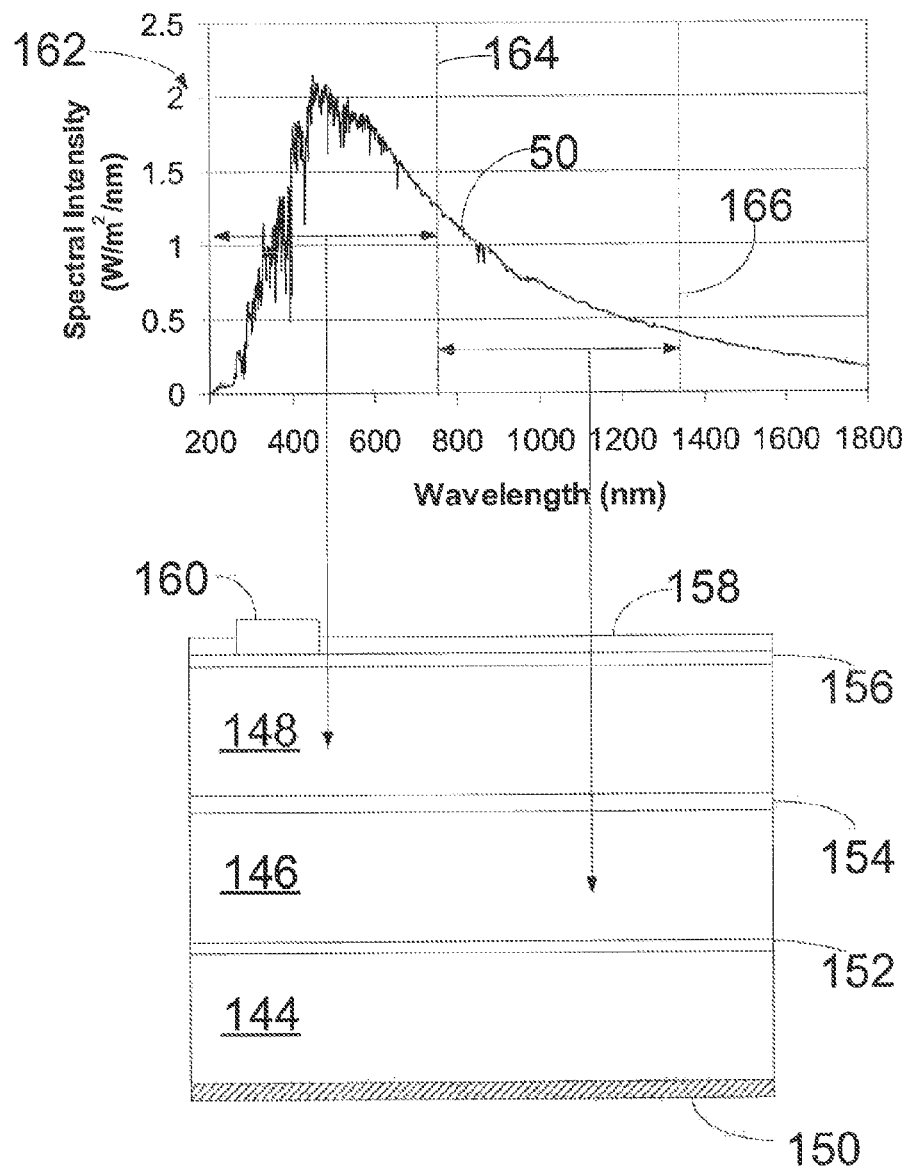
FIG. 6 depicts a monolithic two-subcell photovoltaic solar cell of the present disclosure.

A dual-junction photovoltaic solar cell of the present disclosure is depicted in FIG. 6. The dual-junction solar cell comprises a substrate 144 upon which a first subcell 146 is pseudomorphically grown by epitaxy and comprises a first self-assembled In(Ga)As/GaAs quantum dot material, tailored to obtain an effective bandgap of about 0.92 eV. The details of first subcell 146 are similar to the ones of the second subcell 30 of FIG. 2, disclosed in FIG. 4 and its corresponding description. A second subcell 148 is pseudomorphically grown by epitaxy on first subcell 146 and may comprise a second self-assembled quantum dot material, preferably having AlInAs/AlGaAs quantum dots, and tailored to obtain an effective bandgap of about 1.6 eV. In this embodiment, the substrate 144 is preferably a conductive GaAs substrate or a conductive Ge substrate, each of them having a similar lattice constant.

As discussed previously for other multijunction embodiments, the doping of substrate 144 can be n-type or p-type. Whether substrate 144 is n-type with an n-p or an n-i-p junction grown on top or, p-type with a p-n or a p-i-n junction grown on top, is not fundamental to the present disclosure. For illustration purposes, this embodiment will use an n-type substrate with n-p or n-i-p junctions. Other possible combinations, which could include an undoped substrate and buried back contacts, are equally possible. In the final steps of the process, the substrate 144 may be metallized to form an ohmic contact 150, as illustrated in FIG. 6.

A buffer and/or back field layer 152 can be grown on the substrate 144 prior to growth of the first subcell 146 in order to optimize various structural, electrical, or optical properties. The first subcell 146 is electrically connected to second subcell 148 via a tunnel junction 154. In this embodiment, the tunnel junction 154 may comprise a highly doped InGaP, or AlGaAs n-p junction having a bandgap greater than about 1.7 eV. Alternatively, other similar AlInGaAsP alloys can be used. The second subcell 148 is essentially an n-p or an n-i-p junction pseudomorphically grown by epitaxy. As stated above, second subcell 148 may comprise a self-assembled AlInAs/AlGaAs quantum dot material, tailored to obtain an effective bandgap of about 1.6 eV. Alternatively, the second cell 148 may be made of doped bulk GaInP or AlGaAs or other similar InAlGaAsP alloys having an alloy composition giving a bandgap of about 1.6 eV. The second subcell 148 may have a window 156, an antireflection coating 158, and an electrical contact 160, as is customary in the fabrication of multijunction solar cells.

The top part of FIG. 6 shows a graph 162 of the spectral intensity as a function of wavelength for the solar spectrum 50. The graph 162 also illustrates absorption ranges 164 and 166 of the solar spectrum 50 for the first cell 146 and the second cell 148 respectively. It will be clear for someone skilled in the art, with the help of the description of FIG. 1, that such a dual-junction photovoltage solar cell will have good current matching between the subcells together with high conversion efficiencies.

For this embodiment, the structure of subcells having a self-assembled quantum dot material layer structure would be similar to that disclosed in FIG. 4 and its associated description. However, the growth conditions are changed to obtain the desired optical, electrical and structural properties. In particular, the size and the composition of the quantum dot or the material adjacent to the quantum dots are modified to extend the absorption of the self-assembled quantum dot material to longer wavelengths for the first subcell 146, and to shorter wavelengths for the second subcell 148. As discussed previously, there are many combinations of parameters that can accomplish the desired goal.

For illustrations purposes of the present embodiment, the desired absorption characteristics of the self-assembled quantum dot material of first cell 146 can be obtained by growing InAs on GaAs, the thickness of InAs being comprised between 0.5 and 0.8 nm, preferably between 0.50 and 0.58 nm. The preferred growth rate of InAs is comprised between 0.001 and 3 nm/s, more preferably between 0.01 and 0.03 nm/s, with a growth pause following the InAs deposition (growth), the growth pause preferably ranging from 0 to 300 seconds. The growth of the InAs quantum dot layer is followed by the over-growth of a barrier layer having a thickness ranging from 6 nm to 50 nm, the barrier layer preferably being a GaAs layer or an alloy having a similar bandgap. The growth sequence of quantum dot layer and barrier layers is repeated a number of times as stated previously.

As mentioned above, a specific temperature cycling of the substrate 144 may be used to adjust the shape, composition, and uniformity of the quantum dots during the overgrowth of the quantum dot layer. In this case, the temperature of the substrate 144 is increased preferably above the InAs disorption temperature and decreased back to its nominal value before the growth of the subsequent quantum dot layer. In the case where the desired absorption edge is about 0.92 eV, the temperature cycling performed during the over-growth may occur when the thickness of the barrier is comprised between 1 and 50 nm, preferably between 2 and 11 nm, more preferably between 7.5 and 11 nm. Additionally, alloys of slightly lower bandgap material than GaAs such as InGaAs with low concentration of indium, or graded bandgap material, can also be grown adjacent to the quantum dot layer in order to extend the absorption to longer wavelengths.

A similar method is used to obtain the self-assembled quantum dot material having the desired properties for the second subcell 148; however, AlInAs quantum dots are used instead of InAs quantum dots and the GaAs barrier material is replaced by an AlGaAs barrier material. The nominal percentage of Al in the barrier can be between 0% and 100%, but is preferably between 0% and 35%, in order to maintain a direct bandgap material. More preferably, the Al percentage is comprised between 25% and 35%. The nominal percentage of In in the quantum dots can be between 35% and 100%, but is preferably between 50% and 75%, and more preferably between 55% and 70%. The thickness of AlInAs used to form the self-assembled quantum dot layer is preferably comprised between 0.7 nm and 1.2 nm, and more preferably between 0.8 nm and 0.9 nm.

Alternatively, for the second subcell 148, an equivalent structure can be fabricated by using InP quantum dots instead of AlInAs quantum dots and GaInP barriers instead of AlGaAs barriers. Other alloys latticed-matched to GaAs, such as GaAlInP or GaInPAs, can be used in the barriers.

The present disclosure can be applied to other embodiments and materials, for example, a dual-junction monolithic solar cell grown on an InP substrate. This dual-junction cell has a first subcell, which is essentially an n-p or n-i-p junction, preferably comprising InAs quantum dot material within InGaAs barriers lattice-matched to InP. The dual-junction cell also has a second subcell, which is essentially an n-p junction preferably made of doped bulk AlInAs or of a similar alloy latticed-matched to InP such as AlInGaAs or GaInPAs. The first subcell of this embodiment has an extended absorption range compared to Ge since it absorbs photons of energies as small as about 0.65 eV. The disposition of the first and second subcells is the same as depicted in FIG. 6. The second subcell may be optional in some further embodiments. In an embodiment where the second subcell is optional, a lower conversion efficiency might be obtained, but to the benefit of a simpler manufacturing and lower cost and/or higher radiation or defect hardness.

Another embodiment of interest uses a germanium substrate to form a high efficiency dual-junction monolithic photovoltaic solar cell. Here again, the disposition of the first and second subcells is as depicted in FIG. 6. A first subcell, which is essentially an n-p or n-i-p junction, is made of Ge pseudomorphically grown on the Ge substrate by epitaxy or other similar deposition, implantation, or interdiffusion techniques as discussed for the subcell 110 of FIG. 5. The second subcell, which is essentially an n-p or n-i-p junction, preferably comprises InGaAs quantum dot material within AlGaAs barriers (or similar alloys such as, for example, AlGaP alloys) pseudomorphically grown by epitaxy with a lattice constant close to that of Ge. Such a dual-junction cell using a Ge substrate might not be as efficient as other possible embodiments discussed herein but, will benefit from simpler manufacturing, higher flexibility from the wide combination of choices for the barrier layers and of the quantum dot layers, and from higher radiation and defect robustness leading to higher end-of-life efficiencies.

Another embodiment particularly interesting uses a silicon substrate to form a high efficiency dual-junction monolithic photovoltaic solar cell. Here again, the disposition of the first and second cells is as depicted in FIG. 6. A first subcell, which is essentially an n-p or n-i-p junction, preferably comprises Ge or SiGe quantum dot material and Si barriers pseudomorphically grown on the Si substrate by epitaxy or other similar deposition techniques. Thin film methods or combinations of methods for growing semiconductor crystals can also be used. The second subcell, which is essentially an n-p or n-i-p junction, preferably comprises InP quantum dot material within GaP barriers (or similar alloys such as such as AlGaP) pseudomorphically grown on Si by epitaxy. The dual-junction cell using a Si substrate can also be designed to use self-assembled quantum dot material in the second sub-cell grown on a conventional crystalline or poly-crystalline Si first cell in order to obtain improved efficiencies. The second subcell may be optional in some further embodiments. In an embodiment where the second subcell is optional, a lower conversion efficiency might be obtained, but to the benefit of a simpler manufacturing and lower cost.

As mentioned above, self-assembled quantum dot materials have been shown to produce devices that are orders of magnitude more radiation and defect robust. The higher radiation and defect robustness is a consequence of the combination of: (A) spatial confinement isolating regions with defects, (B) favourable diffusion length damage coefficient due to the nanostructures, (C) elimination of current limiting restrictions in the subcells most affected by radiation, and (D) solar cell design without a current-limiting cell. This makes devices having self-assembled quantum material particularly attractive for space applications. The solar cells of the embodiments describe above would benefit from radiation hardness in applications where the devices are exposed to radiations. For example, an optimized solar cell will have a beginning-of-life efficiency of about 40%. Assuming that this optimized solar cell has a radiation hardness improved by two orders of magnitude with respect to conventional solar cells, the end-of-life efficiency would be higher than 38% for an end-of-life defined as the equivalent to a total dose of $1 \times 10^{15}$ $cm^{-2}$ of 1 MeV electron radiation.

It can be desirable to have embodiments of the present disclosure that exploit and/or to optimize the defect hardness, even while partially sacrificing some of the conversion efficiency. For example, a dual-junction solar cell may include a Si substrate upon which is metamorphically grown a plurality of GaAs/AlGaAs layers to make a transition buffer layer. On this transition buffer layer is epitaxially grown a first subcell comprising self-assembled In(Ga)As/GaAs quantum dot material, tailored to obtain an effective bandgap of about 0.92 eV. A second subcell, which could be optional in some embodiments, is grown by epitaxy on the first subcell and may comprise self-assembled quantum dot material preferably made of AlInAs/AlGaAs quantum dots, and adapted to obtain an effective bandgap of about 1.6 eV. In this embodiment, a significant concentration of defects will be presence due to the large lattice mismatch between Si and GaAs. However, the conversion efficiency could be acceptable for some applications due to the defect hardness of the self-assembled quantum dot material.

In addition to defect hardness, other advantages of the disclosure may be realized. For example, a self-assembled quantum dot material can enhance the conversion efficiency by recovering some of the photon energy that is in excess of the semiconductor bandgap, which would otherwise be lost when photons having higher energies than the effective bandgap impinge on the multi-junction solar cell. As is well known, the energy in excess of the effective bandgap can generate phonons. Some of these phonons will be re-absorbed within the quantum dots and be used in thermionic emission processes by raising photocarriers from confined quantum dot states to higher, unconfined, states, before being swept across the depletion region. Hence the higher efficiency.

Figure 7:
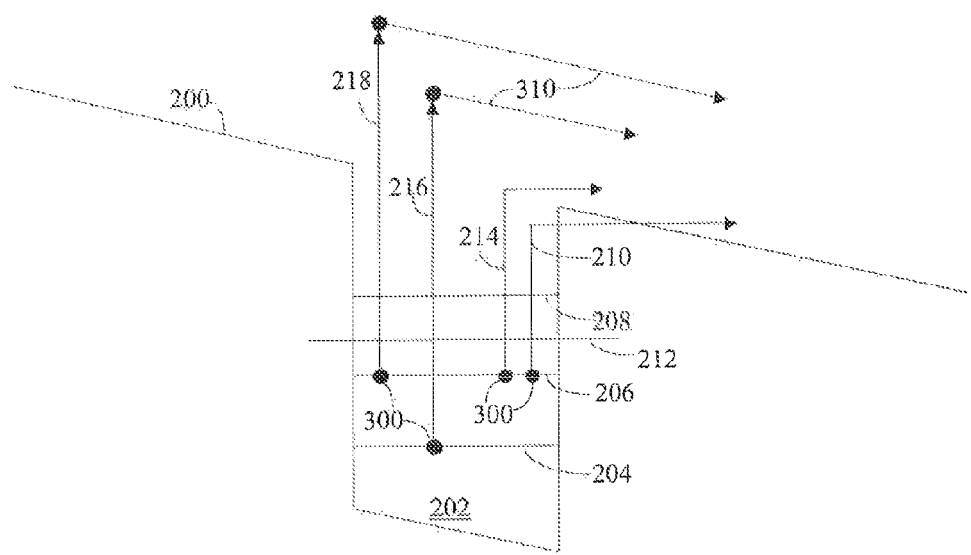
FIG. 7 depicts a conduction band of a quantum dot.

Other, similar schemes to optimize the conversion efficiency can be incorporated in embodiments of the disclosure. For example, self-assembled quantum dot materials can be doped with a controlled residual doping to act as detectors in the longer infrared wavelengths. Detection processes would use intraband absorption simultaneously with the interband transitions, and therefore increase the subcell currents by using a larger fraction of the total solar photon flux. This is shown in FIG. 7 where a biased conduction band edge 200 is shown to form a potential well 202 at a quantum dot. Electronic quantized energy levels 204, 206 and 208 are shown in potential well 202 together with the quasi-Fermi level 212. Electrons 300 are shown to populate levels 204 and 206. Long wavelength infrared intraband absorption transitions (shown as 216 and 218), which are not normally present in solar cells, create additional photocarriers that drift in the device as shown by arrows 310. This type of absorption could be significant since approximately 20% of the solar photon flux is in the energy range lying below the Ge bandgap.

The proposed approach can also be extended to other embodiments and material systems. For example semiconductor self-assembled quantum dots containing diluted nitrides such as InGaAsN or similar semiconductor alloys containing a small fraction of nitrogen, or In(Ga)N quantum dots within Ga(Al)N barriers, or using antimony-based material system such as InSb self-assembled quantum dots in Ga(Al)Sb barriers or similar alloys. Obviously the disclosure could also benefit applications other than solar energy conversion, but also requiring the efficient conversion of a broadband source of photons into electrical signals.

Solar cells with self-assembled quantum dot layers can require that multiple layers of self-assembled quantum dots, interposed with respective barrier material layers, be formed atop a substrate. As self-assembled quantum dots and self-assembled quantum dot layers can perturb the crystalline matrix in which they are formed, growing multiple layers of self-assembled quantum dots interposed with barrier layers can lead to a growth front with defects if the growth conditions are not well-controlled or deviate from optimum values. The same can be said in instances where, instead of (or in addition to) multiple layers of self-assembled quantum dots, strained layers (compressive strain or tensile strain) are interposed with respective barrier material layers.

This can be a problem particularly when the self-assembled quantum dot layers have significant strain therein; that is strain present, locally in, or around the self-assembled quantum dots. For greater certainty, a growth front, as used in the present disclosure, is defined as the interface between an epitaxially-forming semiconductor structure and the growth chamber in which the semiconductor structure is being formed. Ad-atoms attach to the growth front to form a new growth front.

The onset of growth front deterioration can be related to the number of alternating self-assembled quantum dot layers and barrier layers that are formed atop each other (or, in the case of strained layer other than self-assembled quantum dot layers, to the number of strained layers and barrier layers). Formed atop each other is synonymous to formed on each other, disposed on each other, located on each other, etc. The onset of growth front deterioration can also be related to the lattice constant mismatch between the self-assembled quantum dot material and the barrier material. Lattice constant mismatch refers to the difference in the nominal lattice constants of the self-assembled quantum dot material and the barrier material, the nominal lattice constant of a material is the lattice constant by itself, without any strain applied by external agents. The in-plane lattice constant of a material grown on a base layer can differ from the nominal lattice constant of the material when the base layer has a lattice constant different than the nominal lattice constant of the material. This "different lattice constant" can be referred to as the "as grown" lattice constant.

Figure 8:
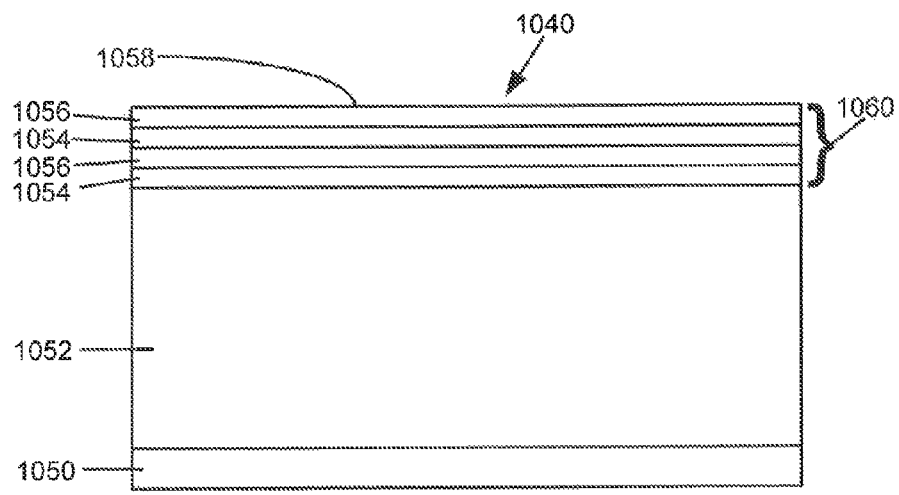
FIG. 8 shows a exemplary arrangement of semiconductor layers that can be used in solar cells.

FIG. 8 shows an exemplary arrangement 1040 of a semiconductor substrate 1050, which can be, for example, a germanium (Ge) substrate, upon which is formed a structure 1052, which can include, for example, gallium arsenide (GaAs). The structure 1052 can also be referred to as an intermediary layer. Atop the structure 1052 are formed alternating self-assembled quantum dot layers 1054, which can include, for example, indium gallium arsenide (InGaAs) or indium arsenide (InAs), and barrier layers 1056, which can include, for example, GaAs, AlGaAs, or GaInP. The top surface of the topmost barrier layer 1056 forms, in the present example, a growth front 1058. The alternating self-assembled quantum dot layers 1054 and barrier layers 1056 form a grouping of layers, which is shown in FIG. 8 as grouping 1060. The exemplary arrangement 1040 shows two self-assembled quantum dot layers 1054 and two barrier layers 1056; however, the number of such self-assembled quantum dot layers 1054 and barrier layers 1056 can vary as described below. Further, as described elsewhere in the present disclosure, the exemplary arrangement 1040 can be used in manufacturing high-efficiency solar cells.

As will be understood by the skilled worker, the structure 1052 need not be grown on the substrate 1050. Instead, generally, the structure 1052 can be grown on any suitable base material which can be, for example the substrate 1052, or an epitaxially-grown semiconductor layer, or any other suitable material.

As will be understood by the skilled worker, the present disclosure also applies to embodiments where the self-assembled quantum dot layers 1054 are replaced by strained semiconductor layers free of self-assembled quantum dots. As an example, strained layers can include $In_xGa_{1-x}As$ layers that have an indium fraction ranging between, for example, 20% (x=0.2) and 100% (x=1).

The onset of deterioration of the growth front 1058 can be determined in numerous ways. For example, the quality, or lack thereof, of the growth front 1058, can be determined by analyzing the morphology of the growth front 1058, post-growth of the arrangement 1040. This can be achieved by analyzing the growth front 1058 using an atomic force microscope (AFM), in the case of truncated structures such as shown in the arrangement 1040 of FIG. 8; or by using a transmission electron microscope (TEM) in which case fully grown structures comprising multiple groupings of self-assembled quantum dot layers 1054 and barrier layers 1056 can be probed, for example, by looking at cross-sectional views of that structure. Other techniques such as Scanning Electron Microscopy (SEM) can also be used.

Further, the quality of the growth front 1058 can be determined by probing, post-growth, the optical properties, electronic properties, or both, of the arrangement 1040. This can be achieved by measuring the optical spectral response (quantum efficiency) of the photocurrent (PC) or photovoltage (PV), photoluminescence (PL), electroluminescence (EL), time-resolved photoluminescence (TRPL), time-resolved photo-current (TRPC), electron-beam induced current (EBIC) measurements, etc., of the arrangement 1040. Such techniques can help determine the minority carrier lifetime and its dependency on the number of self-assembled quantum dot layers 1054 and barriers layers 1056 within the grouping 1060 (or the multiple groupings, as the case may be). Reflection high energy electron diffraction (RHEED) and optical reflectance of the arrangement 1040 can also be used to obtain surface roughness and morphology information of the growth front 1058 during or after the growth of the arrangement 1040.

Additionally, in situ techniques, giving a real-time feedback on the morphology of the growth front 1058 as it progresses, can be used to determine the quality of the growth front 1058. Such in situ techniques include reflection of photon (light) or electron beams during epitaxial growth of the arrangement 1040. These techniques can also provide a measurement of the curvature of the semiconductor wafer or base material upon which the remainder of arrangement 1040 is formed, to evaluate if there are any strain build-up or strain-relaxation events occurring during the epitaxial growth. Growth conditions/parameters can be adapted as a function of the in situ monitoring to compensate for any undesired effects observed during growth. For example, as mentioned elsewhere in the disclosure, the thickness of the barrier layer 1056 and/or of the spacer layer 1062 of FIG. 9, described below, can be adjusted during the growth to achieve desired target values of the wafer curvature as monitored using such techniques.

Figure 9:
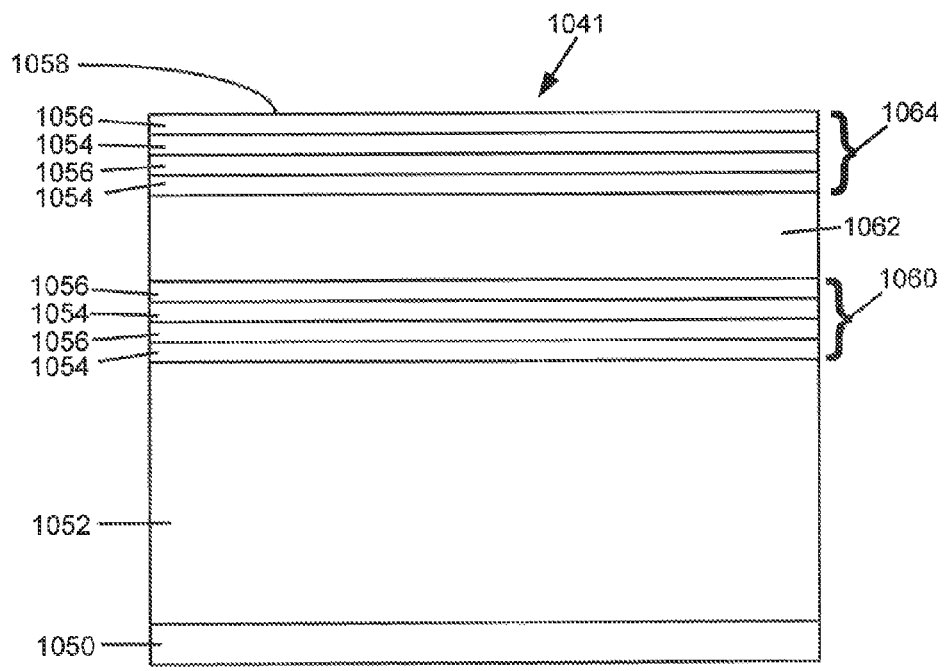
FIG. 9 shows another exemplary arrangement of semiconductor layers that can be used in solar cells.

For a target set of growth parameters (alloy composition, layer thicknesses, temperature, doping, gas pressure), upon having determined the number of alternating self-assembled quantum dot layers 1054 and barrier layers 1056 that can be formed atop each other before the onset of growth front deterioration, other structures or arrangements employing substantially the same materials, under the same epitaxial growth conditions can be formed with additional groupings of self-assembled quantum dots layers 1054 and barrier layers 1056 atop the grouping 1060. FIG. 9 shows an exemplary arrangement 1041 that includes the arrangement 1040 of FIG. 8 and an additional grouping 1064 of alternating self-assembled quantum dot layers 1054 and barrier layers 1056 formed on a spacer layer 1062. These barrier layers of the grouping 1064 can be grown with the same growth conditions as the barrier layers of the grouping 1060 or with different growth conditions than the barrier layers of the grouping 1060, for example (different alloy composition, temperature, doping, gas pressure).

The spacer layer 1062 can include the same material as the barrier layer 1056. Alternatively, the spacer layer 1062 can include a different material, or several different materials, from the barrier layer material. Further, the spacer layer 1062 can include quantum heterostructures such as, quantum wells, quantum lines or wires, and quantum dots. The spacer layer 1062 can be formed after a minimal growth front deterioration is observed, or expected, in order to fix, or prevent, any damage to the growth front. The spacer layer can be formed prior to the onset of significant growth front deterioration.

The target thickness of the spacer layer 1062 can be determined using the techniques described above in relation to the determination of the onset of deterioration of the growth front 1058 or using wafer curvature monitoring as mentioned above. Depending on the choice of material used in the spacer 1062, the optimal thickness of the spacer layer 1062 may vary. For example a spacer layer 1062 too thin would not be expected to completely fix the underlying growth front and/or may result in a non-optimal overall average in-plane lattice constant for the quantum material (as will described elsewhere in the disclosure, the overall average in-plane lattice constant can refer to a thickness-weighed average of the nominal in-plane lattice constant of the layers). On the other hand, a spacer layer 1062 too thick may actually deteriorate the growth front if the combination of residual strain and thickness is not optimal.

The overall strain/composition of the quantum dot and spacer layers can be calculated, and/or measured, and/or monitored, and taken into account to ensure that the average lattice constant of the stack (all semiconductor layers formed on the base material (e.g., the substrate 1050)) is maintained constant relative to the substrate. This can be done in order to keep the growth pseudomorphic and obtain structures (devices) with low defect densities, as is typically desired for high-performance solar cells. X-ray diffraction measurements can also be used to evaluate the overall material quality and local and average strain/composition of the arrangements 1040 and 1041. For an optimized pseudomorphic configuration, the X-ray data can display a main diffraction peak within a couple of hundreds part-per-million (ppm) from a substrate diffraction peak, with Pendellosung fringes (peaks) from the periodic arrangement centered on each side of the main peak.

The thickness of the spacer layer 1062 can be determined in accordance with (as a function of) a target, thickness-weighed average lattice constant value for the layers formed on the semiconductor substrate 1050 (on the base material). In the case of the arrangement 1041 of FIG. 9, the thickness-weighed average lattice constant can be expressed as $\langle a \rangle$, which can be calculated as:

$$\langle a \rangle = \frac{\sum_{i=1}^{\substack{\text{total number} \\ \text{of layers}}} a_i t_i}{\text{total thickness of layers formed on substrate}} \quad (1)$$

with $a_i$ being the nominal lattice constant of layer 'i' and $t_i$ being the thickness of layer 'i'. Therefore, for the arrangement 1041, $\langle a \rangle$ can also be expressed as:

$$\langle a \rangle = \frac{a_{1054} \sum_i t_{1054i} + a_{1056} \sum_i t_{1056i} + a_{1062} t_{1062} + a_{1052} t_{1052}}{\sum_i t_{1054i} + \sum_i t_{1056i} + \sum_i t_{1062} + t_{1052}} \quad (2)$$

with $a_{1054}$ being the nominal lattice constant of the self-assembled quantum dot layers 1054;

$t_{1054i}$ being the thickness of self-assembled quantum dot layer 'i' ('i' being comprised between 1 and the total number of self-assembled quantum dot layers 1054);

$a_{1056}$ being the nominal lattice constant of the barrier layers 1056;

$t_{1056i}$ being the thickness of barrier layer 'i' ('i' being comprised between 1 and the total number of barrier layers 1056);

$a_{1062}$ being the nominal lattice constant of the spacer layer 1062;

$t_{1062}$ being the thickness of the spacer layer 1062;

$a_{1052}$ being the nominal lattice constant of the structure 1052;

$t_{1052}$ being the thickness of the structure 1052: and the summations $$\sum_i$$

extending over all respective layers 1054 and 1056.

The value ⟨a⟩ is calculated in accordance with the various lattice parameter values typically at the growth temperature or at the intended device operating temperature of the layer to which is associated the lattice parameter value in question. Optimization for the growth temperature will typically optimize the crystal quality during growth. This will typically result in higher device performance but will typically also result in residual strain at the intended device operating temperature, or similarly at the test/characterization temperature. The strain difference between operating temperature and growth temperature is caused by the different coefficients of thermal expansion (CTEs) when different materials are used for the substrate vs the epilayers. A target value for ⟨a⟩ can therefore be determined based on various considerations of performance and the impact of residual strain at growth temperature and/or at the operating temperature. For clarity, the target value for ⟨a⟩ can therefore be chosen for around the growth temperature, for around the operating temperature, for values in between these two values, or also in some cases for values outside that range. Typically, the performance optimization will favour minimizing the strain at growth temperature by choosing ⟨a⟩ close to the base material lattice constant at around the growth temperature, but alternatively, the choice of ⟨a⟩ can be made to achieve a target value of strain at operating temperature for example for reliability and/or other manufacturing considerations.

The target value of the thickness-weighed average lattice constant ⟨a⟩ can be equal to the lattice constant value of the substrate 1050 (or, generally, of the base material upon which the structure 1052 is formed). The target value of the thickness-weighed average lattice constant ⟨a⟩ can also be less than the lattice constant value of the substrate 1050 or greater than the lattice constant value of the substrate 1050.

Figure 10:
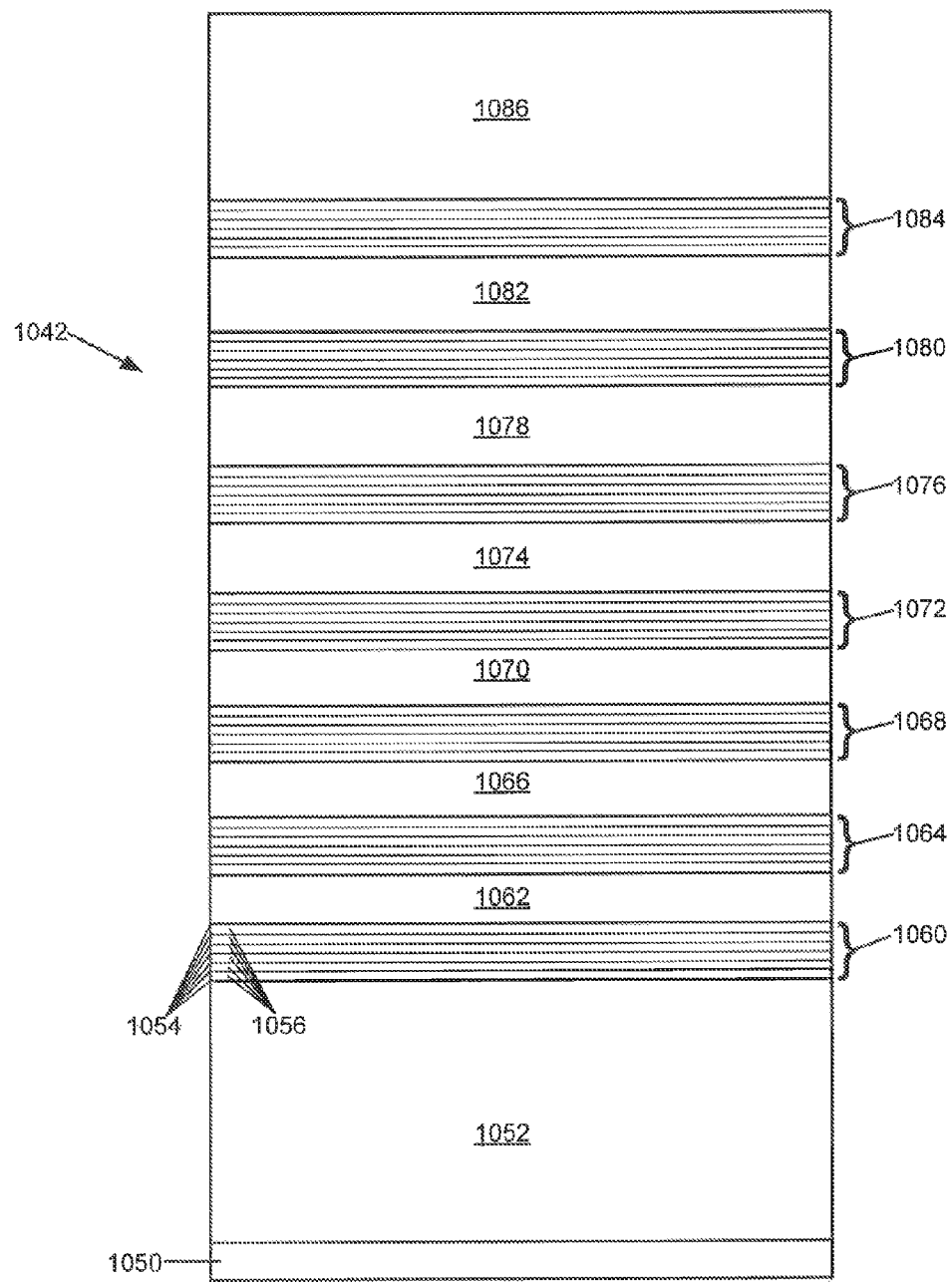
FIG. 10 shows yet another exemplary arrangement of semiconductor layers that can be used in solar cells.

FIG. 10 shows an exemplary arrangement 1042 of seven groupings 1060, 1064, 1068, 1072, 1076, 1080, and 1084, of alternating self-assembled quantum dot layers 1054 and barrier layers 1056. A structure 1086, which can include spacer layer material can be formed on the topmost grouping 1084. The number of self-assembled quantum dots layers 1054 in each of grouping 1060, 1064, 1068, 1072, 1076, 1080, and 1084, is seven in this example. As such, the exemplary arrangement 1042 of FIG. 10 includes a total of 49 self-assembled quantum dot layers 1054. However, any suitable number of self-assembled quantum dot layers 1054 per grouping can be used, and the number of self-assembled quantum dot layers 1054 per grouping need not be the same for each grouping 1060, 1064, 1068, 1072, 1076, 1080, and 1084. The meaning of the expression: "any suitable number of self-assembled quantum dot layers 1054" is to be understood as a number of self-assembled quantum dot layer 1054 that does not cause noticeable or substantial structural damage to the structure 1042.

The seven groupings 1060, 1064, 1068, 1072, 1076, 1080, and 1084, are separated from each other by spacer layers 1062, 1066, 1070, 1074, 1078, and 1082. The thickness of each spacer layer can be the same as, or differ from, the thickness of other spacer layers without departing from the scope of the present disclosure. Further, any suitable number of groupings can be practiced without departing from the scope of the present disclosure.

The material of the structure 1052 that adjoins the lower-disposed self-assembled quantum dot layer 1054 of the grouping 1060 can be the same material as that comprised in the barrier layers 1056. As for the arrangement 1042, the total thickness of the spacer layers 1062, 1066, 1070, 1074, 1078, and 1082 can be determined in accordance with (as a function of) a target thickness-weighed average lattice constant value for the layers formed on the semiconductor substrate 1050. Further the expression for the thickness-weighed average lattice constant ⟨a⟩ can be expressed generally as in equation (1) above.

As will be understood by the skilled worker, equation (1) can be solved with any suitable equation solving procedure, including solving numerically or graphically. Depending on manufacturing considerations and/or various device optimization strategies, one or several parameters can be fixed to a constant value while one or more parameters are solved in view of a target <a>.

For example, when substantially equal barrier thicknesses are used, $t_{1056i} = t_{1056}$, and when substantially equal strain layer thicknesses are used, $t_{1054i} = t_{1054}$, and $(a_{1056}*t_{1056} + a_{1054}*t_{1054})/(t_{1056}+t_{1054}) \sim a_{1050}$, the substrate lattice constant, then the spacer thickness $t_{1062}$ can be effectively any value if $a_{1062} = a_{1050}$ (assuming also $a_{1052} = a_{1050}$).

For clarity, when the thickness-weighted average lattice constant of the barrier and strain layers is substantially the same as the lattice constant of the substrate, then there is a lot of flexibility in the choice of the spacer thickness. These conditions can therefore be used, for example, to adjust and optimize the growth temperature or other growth parameters during the growth of the spacer layers to regularly insure that the epitaxial growth maintains a high-quality growth front, that the defects in the structure are minimized, and consequently that a high device performance is obtained. This is of particular interest for the technologically important material system consisting of InAs for the strain layer material 1054, GaAs for the barrier layer 1056, Ge for the substrate 1050, and InGaAs lattice-matched to Ge (with an indium alloy concentration of about 1.15%) for layer 1052 and the spacer layers 1062, 1066, 1070, etc. Using the room temperature lattice constant values, for exemplary purposes only, $a_{GaAs}=0.56533$ nm, $a_{InAs}=0.60584$ nm, $a_{Ge}=a_{InGaAs(In\sim1.15\%)}= 0.56575$ nm, then using an InAs thickness of $t_{1054}\sim0.40$ nm and a GaAs layer of $t_{1056}\sim38.2$ nm will satisfy the above condition. As another example, equivalent results would be obtained, if the InAs strain layer is replaced with $In_{0.5}Ga_{0.5}As$ with $a_{1054}\sim0.58558$ nm and now $t_{1054}\sim0.81$ nm.

As mentioned previously, if deviations are measured with in-situ monitoring and/or slightly different compositions or thicknesses are actually used for layers 1054 and/or 1056, then the composition and the thickness of the spacer layers 1062, 1066, 1070, etc can be used to bring back, before the onset of dislocations, the average lattice constant closer to the target value for the thickness-weighted average lattice constant. With the strain-balanced configuration described herein, the strain/stress energy of the materials under compressive or tensile strain are accommodated with deformations and the elastic properties of the materials, as long as the strain-thickness product is kept below the critical thickness as mentioned previously, for example as described by the Matthews-Blakeslee critical layer thickness. The coherently strained pseudomorphic layers typically undergo a vertical tetragonal elongation or compression to accommodate the in-plane lattice constant following a Poisson effect which can be linear or not, depending on the elastic properties, the Young's modulus, the shear modulus, and bulk modulus of the materials involved.

More generally, in the case where N spacer layers, with a lattice constant $a_{spacer}$ and the same spacer thickness, are to be used, it can be shown that the spacer layer thickness is determined as:

$$\text{Spacer layer thickness} = \frac{\langle a \rangle \sum_{i=1}^{\text{\# of layers excluding spacer layers}} t_i - \sum_{i=1}^{\text{\# of layers excluding spacer layers}} a_i t_i}{N(a_{spacer} - \langle a \rangle)} \quad (3)$$

Figure 11:
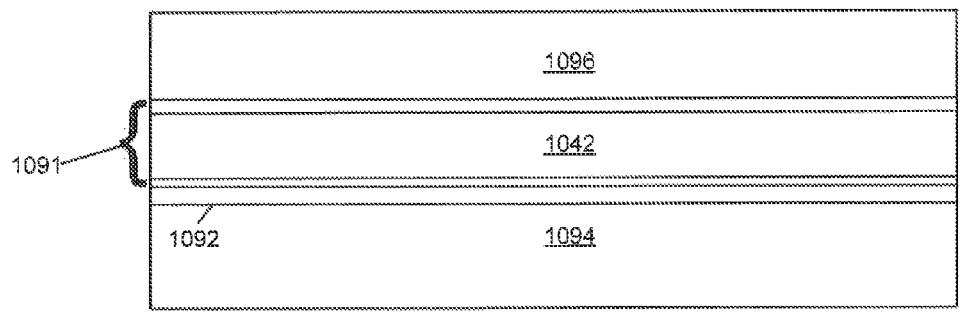
FIG. 11 shows an exemplary three-junction solar cell.

The exemplary arrangement 1040 of FIG. 8, the exemplary arrangement 1041 of FIG. 9, and the exemplary structure 1042 of FIG. 10 can be included within p-n junctions or p-i-n junctions formed in solar cells, which can be monolithic, multijunction, semiconductor photovoltaic solar cells, or could be used in mechanically-stacked subcell arrangements. The arrangements 1041 and/or 1042, or variations and/or combinations thereof, can be incorporated in the base or the emitter of a solar cell, and can be combined with window layers, back surface field layers, tunnel-junction layers, cap, or contact layers. When incorporated within the base of a solar cell, the exemplary arrangement can be incorporated more toward the center of the base of the solar cell, or alternatively, more toward the top or the bottom of the base of the solar cell. The position of the groupings and the combination of the groupings with other elements of a solar cell such as the window layers, back surface field layers, or the other layers mentioned above, can lead to enhanced optical properties and device performance due to formation of stationary optical modes and/or cavity effects where the nodes or the peak of the optical modes can be designed and positioned by, for example, adjusting the thickness of the spacer layer 1062 in the arrangement. Furthermore, variations on the exemplary arrangement 1040, 1041 and 1042, with respect to the number of self-assembled quantum dot layers per grouping and to the number of groupings per arrangement can also be included within p-n junctions or p-i-n junctions formed in solar cells. The solar cells can be single junction solar cells or multi-junction solar cells. FIG. 11 shows an example of such a solar cell. The solar cell 1090 shown at FIG. 11 is a multi-junction solar cell with three junctions that includes a p-i-n junction 1091 whose intrinsic region includes the groupings and spacer layer of the arrangement 1042 of FIG. 10. The p-i-n junction 1091 is formed atop of, and electrically connected to, a p-n junction 1092 formed in germanium (Ge) substrate 1094. A p-n junction 1096 is formed atop of, and is electrically connected to, the p-i-n junction 1091. The electrical connection between p-n and p-i-n junction can be effected through any suitable means, such as a tunnel junction or metal layers (not shown).

The exemplary arrangements 1040, 1041 and 1042 can be pseudomorphic. That is, the as grown, in-plane lattice constant of each of the epitaxially-grown layers formed atop the substrate can be the same as the in-plane lattice constant of the substrate (or of the base material). The substrate can be a vicinal substrate with any suitable orientation angle towards any suitable growth plane. Alternatively, the exemplary arrangements 1040, 1041 and 1042 can be metamorphic. In some metamorphic embodiments, a buffer layer can be formed on the substrate to allow an in-plane lattice constant transition from the substrate material in-plane lattice constant to the buffer layer material lattice constant. Subsequently, the as-grown lattice constant of layers formed atop the buffer layer can be different than that of the buffer layer and of the substrate. In this scenario, the present disclosure can allow good control of a target thickness-weighted average lattice constant of the layers formed atop the buffer layer. This can help minimize the density of defects and subsequent dislocations in the metamorphic configuration.

Figure 12:
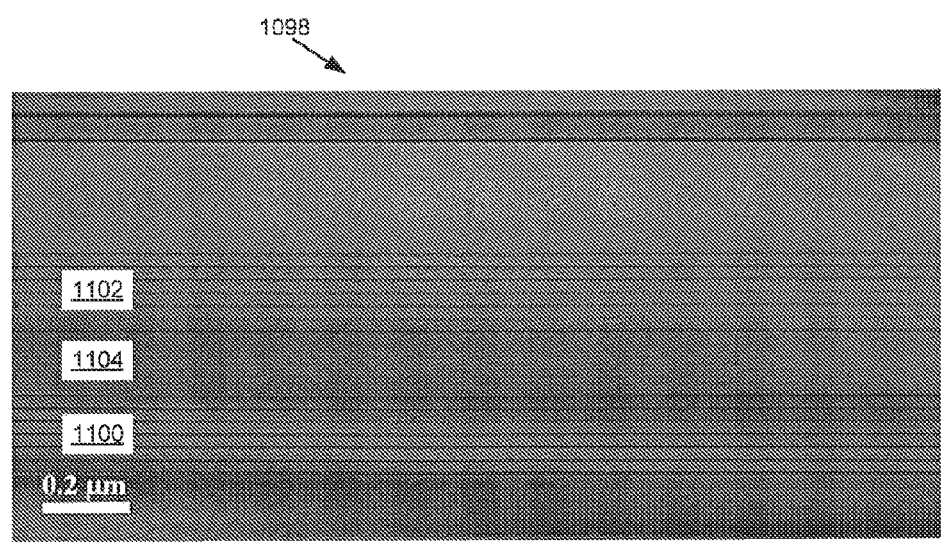
FIG. 12 shows a transmission electron microscope micrograph of two groupings of self-assembled quantum dot layers interposed with barrier layers.

FIG. 12 shows a transmission electron microscope (TEM) micrograph of a solar cell structure 1098 that includes two adjacent groupings 1100 and 1102 of pseudomorphic self-assembled quantum dot layers 1054 and barrier layers 1056. The adjacent groupings 1100 and 1102 are separated by a spacer layer 1104. The quantum dot layers 1054 include indium gallium arsenide (InGaAs), the barrier layers 1056 and the spacer layer 1104 includes GaAs. Seven self-assembled quantum dot layers 1054 are present in each grouping 1100 and 1102. The solar cell structure 1098 was formed in the Stranski-Krastanow growth mode. With seven self-assembled quantum dot layers 1054 per grouping, significant strain can build up. However, the spacer layer 1104 is effective at maintaining a flat, undistorted growth front as evidenced by the sharp interfaces between the self-assembled quantum dot layers 1054 (dark-gray) and the barrier layers 1056 (light-gray). The quantum dots comprised in the self-assembled quantum dot layers 1054 of the exemplary solar cell structure 1098 were grown relatively flat (i.e., platelets, truncated hemispheres, truncated pyramids, truncated dashes, or combinations thereof), and therefore, with the imaging conditions used here, are difficult to distinguish from the wetting layers, which are also obtained in the Stranski-Krastanow growth mode.

The temperature of the substrate 1050 (or 1094) during growth of the self-assembled quantum dots layer 1054 can typically range from 350° C. to 750° C. The temperature of the substrate during growth of the barrier layers 1056 can range from 400° C. to 750° C. The temperature of the substrate during growth of the spacer layers can range from 450° C. to 750° C. The growth rate of the self-assembled quantum dot layer 1056 can range from 0.001 nm/sec to 2 µm/hour. The growth rate of the barrier layers can range from 0.1 µm/hour to 30 µm/hour. The growth rate of the spacer layers (or conditioning layers) can range from 0.5 µm/hour to 30 µm/hour. The group V to group III over-pressures can range from 0.5 to 500. One skilled in the art would recognized that other values of growth conditions values might be possible without departing from the scope of the present disclosure, but the above ranges are typical of common production epitaxial systems.

The self-assembled quantum dot layers 1054 and the barrier layers 1056 can comprise any suitable compound that includes elements from group III and group V of the periodic table of the elements. For example, the barrier material can include GaAs and the self-assembled quantum dot material can include InAs or InGaAs. It is noted that it can be advantageous to chose binary elements such as GaAs for layer 1056 and 1062, etc because it helps remove one element of variability in the manufacturing of such devices, namely the precise composition of the chosen alloy does not change, only the thickness of these layers can vary. Alternative choices include GaInP, AlInP, GaInPAs, AlGaAs, AlGaInP, AlGaInAsP, or similar alloys containing N or Sb as the group V element. As mentioned above, it can also be advantageous to use a spacer layer 1062, 1066, 1070, etc., which is substantially lattice-matched to the base layer (or substrate) in order to be less sensitive to thickness variations of the spacer layers and use those to optimize the growth conditions in these regions. Similarly, for the quantum dot layer 1054, InAs can be a good choice of binary semiconductor giving the advantages mentioned above. Alternatively, InP, GaSb, or InSb can also be a good binary materials for layers 1054 and would also result in self-assembled quantum dot formation during the growth on a GaAs or Ge substrate. One skilled in the art would readily recognized that ternary or quaternary alloys combining some binaries from the group of InAs, InP, GaSb, InSb, InN would also result in the same advantages. Alternatively, II-VI semiconductors could also be used such as ZnSe for layer 1056 and/or 1062. Similarly II-VI semiconductors could also be used such as ZnS, CdTe, ZnTe, MgTe, MgSe, CdSe, CdS, MgS, etc. for layers 1054, although the bandgaps of those alloys is not necessarily best optimized for high-efficiency multi-junction cells. Alternatively to GaAs or Ge substrates, Si substrates could be used, in which case GaP, AlP, InGaN, AlGaN, AlInGaN alloys can also be used as more optimized alloys for the layers 56 and/or 62 when pseudomorphic structures are desired. Alternatively, InP substrates can be used, in which case InP, GaInAs, AlInAs, GaInAsP, AlGaInAsP, GaAsSb, AlAsSb, Cds, ZnSeTe, or CdZnSe alloys can also be used as more optimized alloys for the layers 1056 and/or 1062 when pseudomorphic structures are desired.

As described above, having a spacer layer formed between groupings of self-assembled quantum dot layers interposed with barrier material layers advantageously offers the possibility of manufacturing a solar cell with an increased number of self-assembled quantum dot layers without increasing the density of defects in the solar cell. Further, such spacer layers allows for the possibility of designing layer sequences, which are less sensitive to variations in the growth process parameters. Furthermore, such spacer layers allow for the possibility of optimizing the growth conditions locally, within the self-assembled quantum dot layers, by resetting the growth front regularly between groupings of self-assembled quantum dot layers/barrier material layers. As mentioned previously, in cases for which the disclosure leads to designs with lower sensitivities of the epitaxial parameters during the manufacturing (growth) of the heterostructures, the manufacturing yield can be better by applying designs as described herein. For example the on-wafer radial yield can be improved by maintaining good (uniform) performance in the center of the wafers as well as close to the edge of the wafer where the growth parameters might be different.

Some of the solar cell embodiments of the present disclosure can be useful in the cases where the solar spectrum deviates from the AM0 spectrum shown in FIG. 1. For example, in the case of terrestrial CPV applications, the solar spectrum is different from that shown at FIG. 1 because of atmospheric absorption and because of the concentration optics. In such cases, other spectra such as the ASTM G173-03, AM1.5D, AM1.5G, or other variations may be more representative of the spectrum incident on the solar cell. One of the impacts of such a modified spectrum is that the optimum energy bandgaps for a multijunction solar cell are modified compared to energy bandgaps applicable to the spectrum of FIG. 1.

The performance of a monolithic multijunction solar cell can thus be optimized by using a solar cell with a subcell incorporating self-assembled quantum dots and/or strain layers with an effective-band gap adjusted to better balance the current generated in each subcells and taking into consideration any absorption dip in the solar spectrum or the optics. The optimization can make use of the embodiment incorporating the spacer layers 1062, 1066, 1070, etc as depicted in the exemplary embodiment of FIG. 10, or in other embodiments, or without the spacer layers. In both cases, the optimization for CPV will benefit from a different effective bandgap. For example a three-junction CPV solar cell with a top cell having a bandgap between ~1.8 and ~1.9 eV and an InGaAs or Ge bottom cell having a bandgap between ~1.0 eV and ~0.67 eV, would take advantage of a middle cell effective bandgap in the range between ~1.265 eV and ~1.378 eV. This three-junction configuration can improve the performance for CPV compared to a bulk pseudomorphic cell and can be easily manufacturable using the grouping embodiments described herein.

One with ordinary skill in the art will realize that embodiments using groupings of alternating layers made of group III and group V elements (e.g., GaAs) are well-suited to being grown on a Ge substrate. That is, in order to match the in-plane lattice constant of GaAs to Ge, indium must be included in the GaAs at a fraction of about 1.15%. The indium necessary for the average lattice constant of the layers grown on the Ge substrate to match the in-plane lattice constant of the Ge substrate can be better incorporated using strain-layers, which can also benefit from using the grouping configuration, compared to a bulk alloy. The stain layers and grouping approaches provide more flexibility in the bandgap and strain engineering of high-efficiency devices such as multi-junction solar cells. The enhanced flexibility thus provided can therefore be used to tailor the middle cell bandgap depending on the incident spectrum on the cell (for example the air-mass of the solar spectrum) and/or the transfer function of the concentrating optics.

A series of different embodiments of the disclosure have been presented. All the embodiments related to monolithic semiconductor photovoltaic solar cells comprising at least one subcell having a self-assembled quantum dot material. Details on how to tailor the effective bandgap of a subcell having a self-assembled quantum material were given. The tailoring of the bandgap allows for solar cells having higher conversion efficiencies than prior art solar cells. Embodiments including two, three and four subcells were discussed.

The above-described embodiments of the present disclosure are intended to be examples only. Alterations, modifications and variations may be effected to the particular embodiments by those of skill in the art without departing from the scope of the disclosure, which is defined solely by the claims appended hereto.

What is claimed is:
1. A photovoltaic solar cell comprising:
a Ge base with a Ge lattice constant; and
a plurality of semiconductor layers formed on the Ge base, the plurality of semiconductor layers including:
first layers of a first semiconductor material, the first semiconductor material comprising InAs, the first layers each having a thickness of about 0.40 nm, the first semiconductor material having a first lattice constant;

second layers of a second semiconductor material, the second semiconductor material comprising GaAs, the second layers each having a thickness of about 32.8 nm, the second semiconductor material having a second lattice constant, the second layers being interposed between the first layers; and at least one semiconductor spacer layer comprising InGaAs with an indium concentration of about 1.15%, each of the at least one semiconductor spacer layer having a respective spacer layer lattice constant equal to the Ge lattice constant, the first layers and the second layers being arranged in at least two groupings, each grouping comprising alternating first and second layers that define multiple adjoining pairs of layers, the at least two groupings being separated from each other by one of the at least one semiconductor spacer layer.

2. The photovoltaic solar cell of claim 1 wherein the plurality of semiconductor layers include an intermediary semiconductor layer formed on the Ge base, one of the at least two groupings being formed on the intermediary semiconductor layer.

3. The photovoltaic solar cell of claim 1 wherein the Ge base is one of a Ge semiconductor substrate and an epitaxially-grown Ge semiconductor.

4. The photovoltaic solar cell of claim 1 wherein:
the first layers are compressively strained layers with a first layers bandgap energy, and
the second layers are barrier layers with a barrier layer bandgap energy, the barrier layer bandgap energy being larger than the first layers bandgap energy, and the first lattice constant being larger than the second lattice constant by a factor ranging between 2% and 10%.

5. The photovoltaic solar cell of claim 1 wherein each of the at least one spacer layer has a same thickness.

6. The photovoltaic solar cell of claim 1 wherein:
the Ge lattice constant is a base material lattice constant parallel to a growth plane of the photovoltaic solar cell;
the first lattice constant is a first semiconductor material lattice constant parallel to the growth plane of the photovoltaic solar cell;
the second lattice constant is a second semiconductor material lattice constant parallel to the growth plane of the photovoltaic solar cell;
each respective spacer layer lattice constant is a spacer layer lattice constant parallel to the growth plane of the photovoltaic solar cell.

7. The photovoltaic solar cell of claim 1 wherein the photovoltaic solar cell includes a plurality of p-n junctions.

8. The photovoltaic solar cell of claim 4 wherein the compressively strained layers comprise self-assembled quantum dots.

9. The photovoltaic solar cell of claim 8 wherein the self-assembled quantum dots are coherently strained.

10. The photovoltaic solar cell of claim 4 wherein the compressively strained layers are obtained by epitaxy using a Stranski-Krastanow growth mode.

11. The photovoltaic solar cell of claim 1 wherein the solar cell is a pseudomorphic solar cell.

12. The photovoltaic solar cell of claim 1 wherein the at least one semiconductor spacer layer has a thickness ranging between 50 nm and 500 nm.

13. The photovoltaic solar cell of claim 12 wherein the at least one semiconductor spacer layer has a thickness ranging between 100 nm and 300 nm.

14. A photovoltaic solar cell comprising:
a Ge base with a Ge lattice constant equal to $a_{Ge}$; and
a plurality of semiconductor layers formed on the Ge base, the plurality of semiconductor layers including:
first layers of a first semiconductor material, the first semiconductor material comprising InGaAs, the first layers each having a thickness $t_{InGaAs}$ less than about 1 nm, the first semiconductor material having a first lattice constant equal to $a_{InGaAs}$;
second layers of a second semiconductor material, the second semiconductor material comprising GaAs, the second semiconductor material having a second lattice constant $a_{GaAs}$, the second layers being interposed between the first layers; and
at least one semiconductor spacer layer comprising InGaAs with an indium concentration of about 1.15%, each of the at least one semiconductor spacer layer having a respective spacer layer lattice constant equal to the Ge lattice constant, the first layers and the second layers being arranged in at least two groupings, each grouping comprising alternating first and second layers that define multiple adjoining pairs of layers, the at least two groupings being separated from each other by one of the at least one semiconductor spacer layer, the second layers each having a thickness $t_{GaAs}$ selected to satisfy the equation $$\frac{a_{GaAs} \times t_{GaAs} + a_{InGaAs} \times t_{InGaAs}}{t_{GaAs} + t_{InGaAs}} = a_{Ge}.$$

15. The photovoltaic solar cell of claim 14 wherein a concentration of indium in the first layers is comprised between 35% and 100%.

* * * * *